United States Patent [19]

Itoh et al.

[11] Patent Number: 4,739,497
[45] Date of Patent: Apr. 19, 1988

[54] SEMICONDUCTOR MEMORY

[75] Inventors: Kiyoo Itoh, Higashikurume; Ryoichi Hori, Nishitama, both of Japan

[73] Assignee: Hitachi, Ltd., Tokyo, Japan

[21] Appl. No.: 651,453

[22] Filed: Sep. 17, 1984

Related U.S. Application Data

[63] Continuation-in-part of Ser. No. 380,409, May 20, 1982.

[30] Foreign Application Priority Data

May 29, 1981 [JP] Japan .................................. 56-81042
Sep. 5, 1983 [JP] Japan .................................. 58-161838

[51] Int. Cl.⁴ ...................... G11C 11/40; G11C 13/00
[52] U.S. Cl. .................................. 365/189; 365/230
[58] Field of Search ............... 365/189, 230, 191, 193, 365/226, 233

[56] References Cited

U.S. PATENT DOCUMENTS 3,803,554  4/1974  Bock et al. ........................ 365/189
4,351,034  9/1982  Eaton et al. ...................... 365/189

Primary Examiner—Terrell W. Fears
Attorney, Agent, or Firm—Antonelli, Terry & Wands

[57] ABSTRACT

A semiconductor memory is provided which includes a plurality of data lines, a plurality of word lines which are arranged so as to intersect the plurality of data lines, and a plurality of memory cells which are respectively disposed at intersection points between the plurality of data lines and the plurality of word lines. A row decoder selects at least one from among the plurality of word lines, while a column decoder generates a signal for connecting one of the plurality of data lines to an input/output line. A plurality of wiring leads are also provided which are formed of a conductor layer different from conductor layers constituting the plurality of data lines and the plurality of word lines and which are arranged so as to intersect the plurality of data lines.

26 Claims, 41 Drawing Sheets

SEMICONDUCTOR MEMORY

This application is a continuation-in-part of Ser. No. 06/380,409 filed May 20, 1982.

BACKGROUND OF THE INVENTION

The present invention relates to a semiconductor memory, and more particularly to a semiconductor memory device which has a high packaging density and which is advantageous for attaining a fast operation as well as a high S/N (signal-to-noise) ratio.

As illustrated in FIG. 1, a semiconductor memory is constructed by disposing on a chip 1 a memory array AR in which memory cells MC are arranged in the shape of an array, an X decoder (including a driver) 3 which selects the memory cells MC in a row direction, a Y decoder (including a driver) 4 which selects the memory cells MC in a column direction, timing generator circuits 5 and 6, and besides, an address driver etc. The timing generator circuits 5 and 6 produce various internal timing pulses in synchronism with a clock $\phi$ so as to control various circuit operations. In addition, supply voltages $V_{CC}$ (for example, 5 volts) and $V_{SS}$ (0 volt) are fed to the circuits. Usually, a wiring material of low resistivity such as aluminum is used for power source lines for the supply voltages $V_{CC}$ and $V_{SS}$ or timing signal lines for various internal timings. On the other hand, the aluminum of the same layer is used within the memory array AR.

In such prior-art semiconductor memory, a reading operation is performed as stated below. When external address signals $A_0$-$A_3$ are received as inputs, the X decoder 3 is started. When a word line $X_0$, for example, is consequently selected from among a plurality of word lines $X_0$-$X_3$, a select pulse is delivered to the word line $X_0$, and the memory cells MC connected therewith deliver read signals to corresponding data lines $Y_0$-$Y_3$. Meanwhile, assuming that a select signal from the Y decoder 4 applied through a Y control line 8 turns on a switch $SW_0$ to select the data line $Y_0$, the signal read out to the data line $Y_0$ is delivered to an input/output line I/O through the switch $SW_0$ and is externally provided as a data output $D_0$. In a writing operation, a data input $D_I$ is sent to the input/output line I/O, the switch $SW_0$ and the data line $Y_0$ by a write enable signal WE, and the data is written into the memory cell MC which is connected at the intersection point between the data line $Y_0$ and the selected word line $X_0$.

In such semiconductor memory, however, the power source lines of the supply voltages $V_{CC}$, $V_{SS}$ as well as the lines of the various timing signals and the memory array employ the identical conductor layer, so that they must be formed in regions separate from each other, making it impossible to reduce the area of the chip. For example, in case of encasing the semiconductor memory in a dual in-line package, the shorter side of the chip needs to be suppressed small. In this case, however, the suppression has been limited with the prior art left intact.

In semiconductor memory devices, as the packaging density is increased in order to increase its storage capacity, the capacity of a charge storage portion in each memory cell decreases. In addition, the area of the memory array on a memory chip increases, and the capacitance of a data line, and the length thereof, both increase. Accordingly, it becomes increasingly difficult to attain the features of both fast operation and high S/N ratio.

SUMMARY OF THE INVENTION

An object of the present invention is to reduce the area of the chip of a semiconductor memory.

In order to accomplish the object, according to the invention, wiring leads such as power source lines and various timing signal lines are extended in a direction intersecting the data lines of a memory array, and these wiring leads are disposed within the memory array by the use of a conductor layer different from that of word lines and the data lines. Thus, a region to be occupied by the wiring leads can be curtailed, and the chip area is reduced. Further, since the wiring leads are extended in the direction intersecting the data lines, the capacitive coupling of the wiring per data line is slight, and the data lines are little affected by the signals of the wiring leads. In contrast, when the data lines and the wiring leads are arranged in parallel, the capacitive coupling increases and greatly affects the data lines having minute signals, so that the semiconductor memory might lead to a malfunction.

It is another object of the present invention to provide a semiconductor memory having large storage capacity without a substantial increase in the area needed for the peripheral circuits, and which is capable of fast writing and fast reading and which exhibits a high S/N ratio and a high reliability In order to accomplish this object, according to the invention, word lines and data lines are arranged into a matrix, each data line is divided into sub data lines, each common line is arranged in common to at least two of sub data lines and is connected to said sub data lines through switch means, and each control line is connected in common to at least two of said switch means and a decoder for selecting one of said control lines.

BRIEF DESCRIPTION OF THE DRAWINGS

FIG. 2A is a diagram of the arrangement of an embodiment of the present invention, while

FIG. 14 is a diagram of the arrangement of a sub-array for use in the embodiment of FIG. 12A or 13, while

DESCRIPTION OF THE PREFERRED EMBODIMENTS

Figure 1:
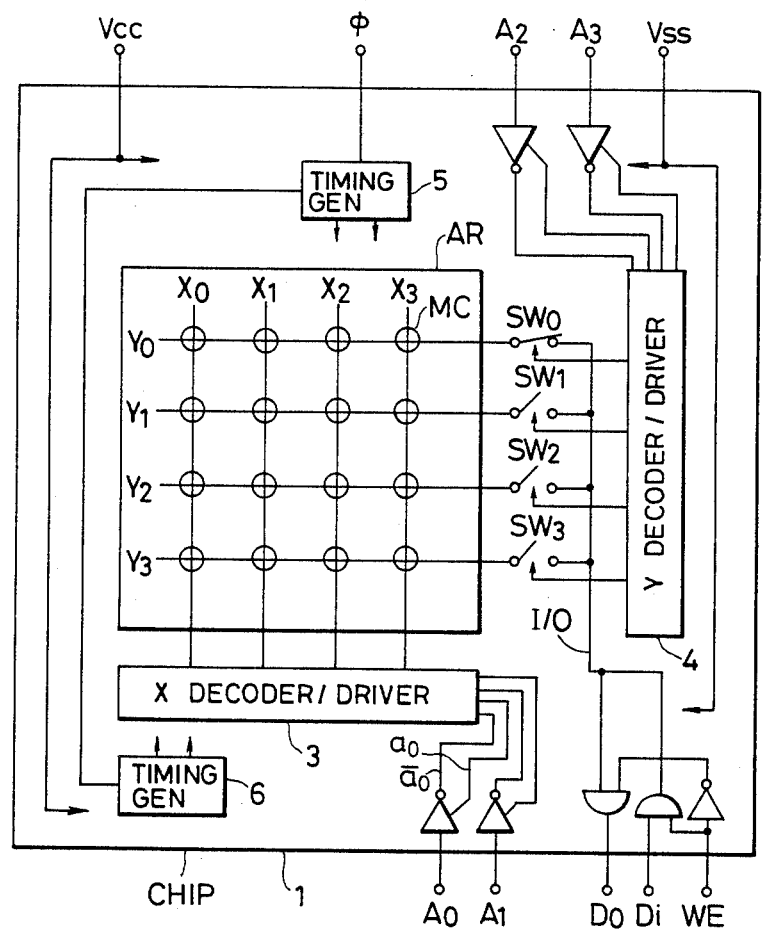
FIG. 1 is a diagram of the arrangement of a prior-art semiconductor memory.
Figure 2A:
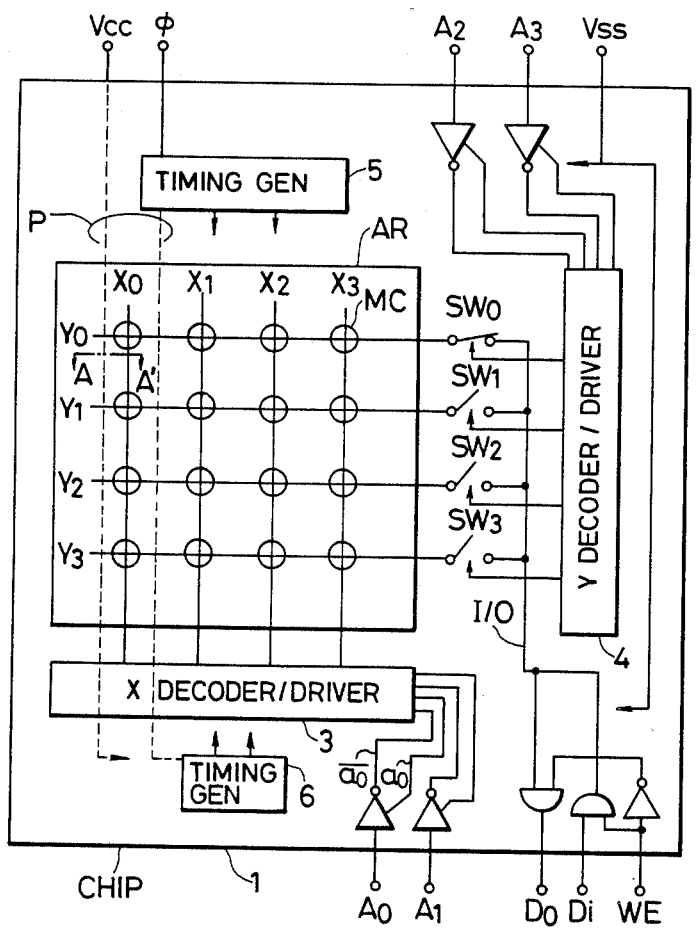
Figure 2B:
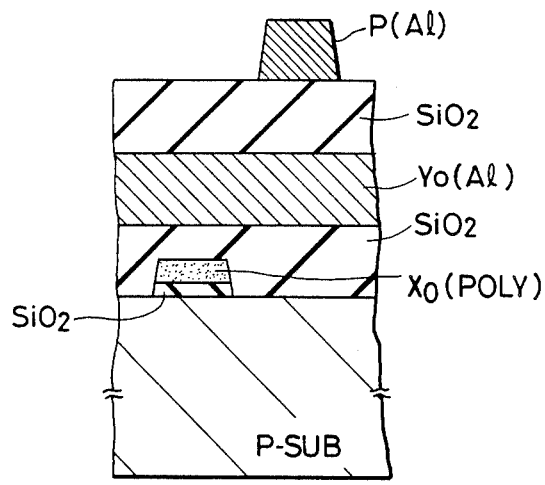
FIG. 2B is a sectional view taken along line A—A' in FIG. 2A.

FIG. 2A shows one embodiment of the present invention, in which the same parts as in FIG. 1 are assigned the same symbols. FIG. 2B is a sectional view taken along line A—A' in FIG. 2A.

The point of difference from the prior art in FIG. 1 is that wiring leads P, such as power source lines and various timing signal lines, are arranged so as to intersect the data lines $Y_0$–$Y_3$ within the memory array AR. In the present embodiment, the word lines $X_0$–$X_3$ are formed of a self-alignment material such as polycrystalline silicon or silicide, the data lines $Y_0$–$Y_3$ are formed of a first layer of aluminum, and the power source lines and various timing signal lines P are formed of a second layer of aluminum. The wiring lead P, the data line $Y_0$ and the word line $X_0$ are insulated therebetween by insulator films ($SiO_2$). They are formed on a P-type silicon substrate.

In FIG. 2B, in order to facilitate understanding, the data line is also depicted as if seen in cross-section.

According to the present embodiment, the power source line and various timing signal lines P pass within the memory array AR, and hence, the shorter side of the chip can be shortened to that extent. Moreover, since the various timing signal lines intersect the data lines $Y_0$–$Y_3$, coupled capacitances are smaller than in the case of arraying them in parallel, and the minute read signals of the data lines are less affected.

Figure 3:
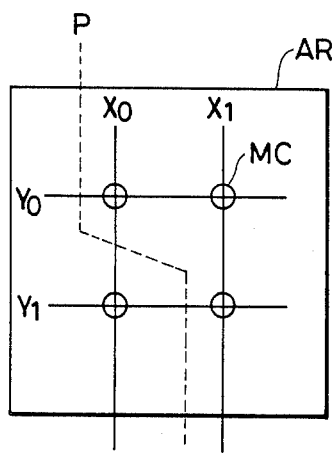
FIGS. 3 and 4 are diagrams each showing the arrangement of another embodiment of the present invention.

Although, in the present embodiment, the power source line and various timing signal lines P are arranged on the memory array AR, only some of them may well be arranged on the memory array. In this case, the shorter side of the chip can be reduced to the extent of the occupying area of the lines arranged on the memory array FIG. 3 shows another embodiment of the present invention. In the example of FIG. 2A, the influence of the capacitive coupling on the minute signals of the data lines is little, but the capacitive coupling of the wiring leads with the word lines arises. The present embodiment is appropriate when this capacitive coupling becomes a problem. In FIG. 3, only the word lines $X_0$, $X_1$ and the data lines $Y_0$, $Y_1$ are illustrated.

Concretely, the power source line and the various timing signal lines are coupled to the plurality of word lines $X_0$, $X_1$. To this end, the power source line and various timing signal lines P are caused to intersect one word line and are passed near the other word line. This is the point of difference from the circuit of FIG. 2. Thus, it is possible to reduce voltages which couple from the power source line and various timing signal lines to the word lines ($X_0$–$X_1$) and voltages which couple from one selected word line to the power source line and various timing signal lines conversely. Consequently, this measure eliminates the drawback that, since the power source line and various timing signal lines are close to a specified word line (for example, the word line $X_0$), only this word line has an increased capacitance as compared with another word line (for example, the word line $X_1$) and is hampered from operating at high speed. In a case where the power source line is thick and extends over a plurality of word lines, it may be caused to intersect the plurality of word lines.

Figure 4:
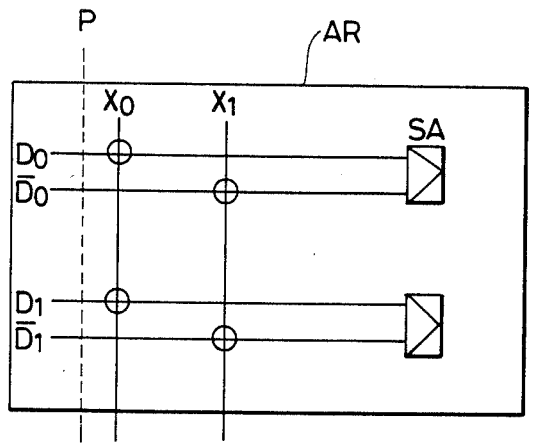

FIG. 4 shows another embodiment of the present invention, which is improvements in the circuit of FIG. 2A.

The present embodiment is the application of the present invention to a folded bit line arrangement cell. The detailed structure of the folded bit line arrangement cell is described in, e.g., IEEE PROC., Vol. 130, Pt. I. No. 3, p. 127, June 1983.

Data lines are constructed of pair lines D and $\overline{D}$, and a memory cell MC which is composed of a transistor and a capacitor is connected to one of the two intersection points between the pair lines and a word line X. The points of difference from FIG. 2A are that the signals of the two data lines are differentially amplified by a sense amplifier SA, and that these two data lines intersect the same timing signal line P.

In the present embodiment, even when the various timing signal lines P couple to the two data lines capacitively, voltages generated by the capacitive coupling become inphase between the two data lines and are cancelled at the differential amplification. For this reason, the capacitive coupling of the various timing signal lines affects the reading of data ver slightly.

In order to reduce voltages which are generated contrariwise by the capacitive coupling of the data lines to the various timing signal lines, a half precharge system may be adopted. This system is such that, before stored information is read out from a memory cell, data lines are precharged to the intermediate level of two voltages "1" and "0" to be written into the memory cell. It is described in, for example, the official gazette of Japanese Patent Application Laying-open No. 54-63632 or ISSCC 1984 Digest of Technical Paper, p. 276, "A 288kb CMOS Pseudo SRAM" and p. 278, "A Sub 100ns 256k DRAM in CMOS III Technology".

With this system, in differentially amplifying the signals by means of the sense amplifier, a change at the time at which the signal of one of the paired data lines becomes a high potential is substantially equal to a change at the time at which the signal of the other data line becomes a low potential, so that potentials attributed to the capacitive coupling of the two data lines are cancelled.

In the above embodiment of FIG. 4, the folded bit line arrangement cell has been exemplified. However, insofar as two paired lines whose signals are to be differentially amplified are juxtaposed and the wiring lead P such as the timing signal line is laid so as to intersect the paired lines respectively, noise components attributed to the capacitive coupling between the wiring lead P and the data lines are cancelled. This holds true of a flip-flop type static memory.

More specifically, the flip-flop type static memory has signal lines in a relationship complementary to each other for one memory cell. Since the complementary signal lines are laid in common for a plurality of memory cells, they are arranged in parallel with each other. Accordingly, the wiring lead P such as the timing signal line can be laid so as to intersect the complementary signal lines respectively, as in the case of the folded bit line arrangement cell, and the noise components ascribable to the capacitive coupling between the wiring lead P and the data lines are cancelled.

Next, there will be elucidated an embodiment wherein the present invention is applied to a memory of the multidivided data line system which is described in U.S. Pat. application No. 380409 (corresponding to Japanese Patent Application Laying-open No. 57-198592) filed by the inventors of the present application before.

Figure 5:
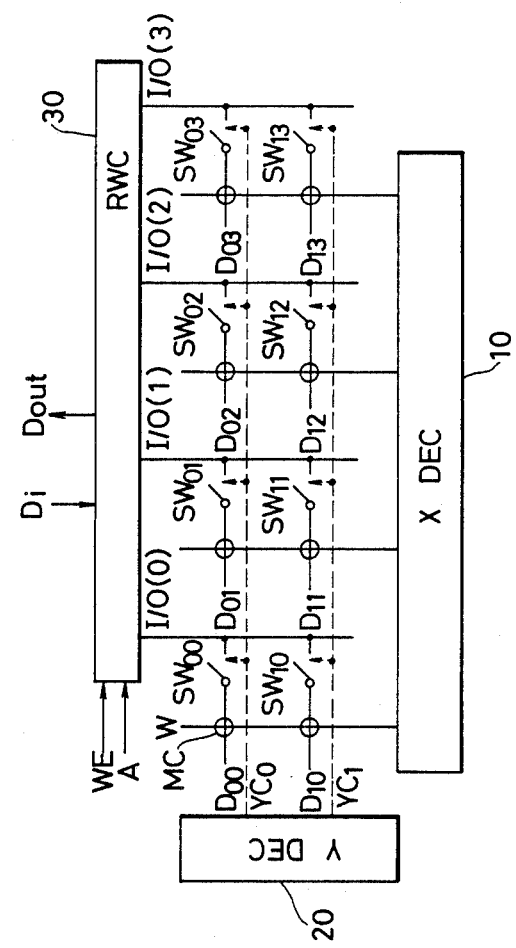
FIG. 5 is a circuit diagram illustrating the structure of a memory array which has a plurality of sub data lines.

FIG. 5 conceptually shows a structure which have a plurality of sub arrays. In a memory wherein word lines W and data lines $D_{ij}$ are arranged into a matrix to form a memory array, each data line is divided into, e.g. $D_{00}$, $D_{01}$, $D_{02}$ and $D_{03}$ as shown in the figure. In parts of the respective divided data lines, there are arranged switches $SW_{00}$, $SW_{01}$, $SW_{02}$ and $SW_{03}$ which are controlled by an output control signal $YC_0$ provided from a circuit block 20 including a Y decoder and a Y driver. Data are exchanged through these switches between the respective data lines and common input/output lines I/O(0), I/O(1), I/O(2) and I/O(3) which are common to other divided data lines (for example $D_{10}$). As a result, data are written into or read out from memory cells MC by a read/write controller 30.

With such a construction, the data lines are divided, so that a read-out signal of high output voltage is obtained from the memory cell MC to the data line $D_{00}$ at high speed by a word selection voltage which is delivered to the selected word line W from a circuit block 10 including an X decoder and a word driver. Moreover, with this construction, no substantial increase in the chip area resulting from the division occurs. The reason is that the circuit block 20 does not have to be duplicated for each divided memory array, so that it is sufficient to provide only one circuit block 20 common to the sub data lines.

When the area of the memory array becomes large as a result of an increase in the storage capacity, the capacitance of the data line increases, so that the read-out voltage decreases. When, in this regard, the data line is shortened by increasing the number of divided memory arrays into, e.g. four memory arrays or eight memory arrays, it is possible to increase the read-out voltage and to raise the writing speed. Since, however, one Y decoder needs to be provided for every two memory arrays and one set of common input/output lines or one sense amplifier needs to be provided for every memory array, these peripheral circuits necessitate a large area being provided which is disadvantageous.

In accordance with such embodiment, the sub lines onto which the data of the memory cells are once read out can have their capacitances reduced owing to the division in the lengthwise direction, so that a reading operation of high speed and high gain is permitted. In addition, even when the number of divisions is increased, one decoder for addressing in the digit direction (Y decoder) suffices, so that substantially no increase in the area occupied by the peripheral circuits results. In accordance with this construction, either the control lines or the common input/output lines need to be laid in the same direction as that of the divided data lines and across the memory array. However, since such wiring can be provided in a multi-level fashion by forming it as a layer different from that of the data lines (sub lines), the area occupied by the memory array is not substantially increased.

in FIG. 5, when lines YC are formed by a manufacturing step different from that of the lines $D_{ij}$, multi-level wiring becomes possible, and hence, the area of the memory array does not increase. By way of example, it is considered that the word lines W are formed of polycrystalline Si or a metal such as Mo, that the principal parts of the data lines are formed of a first layer of Al, and that the control lines YC are formed of a second layer of Al. It is also considered to form the word lines W out of a first layer of Al, the principal parts of the data lines $D_{ij}$ out of a polycrystalline or Si or diffused layer, and the control lines YC out of a second layer of Al.

Figure 6:
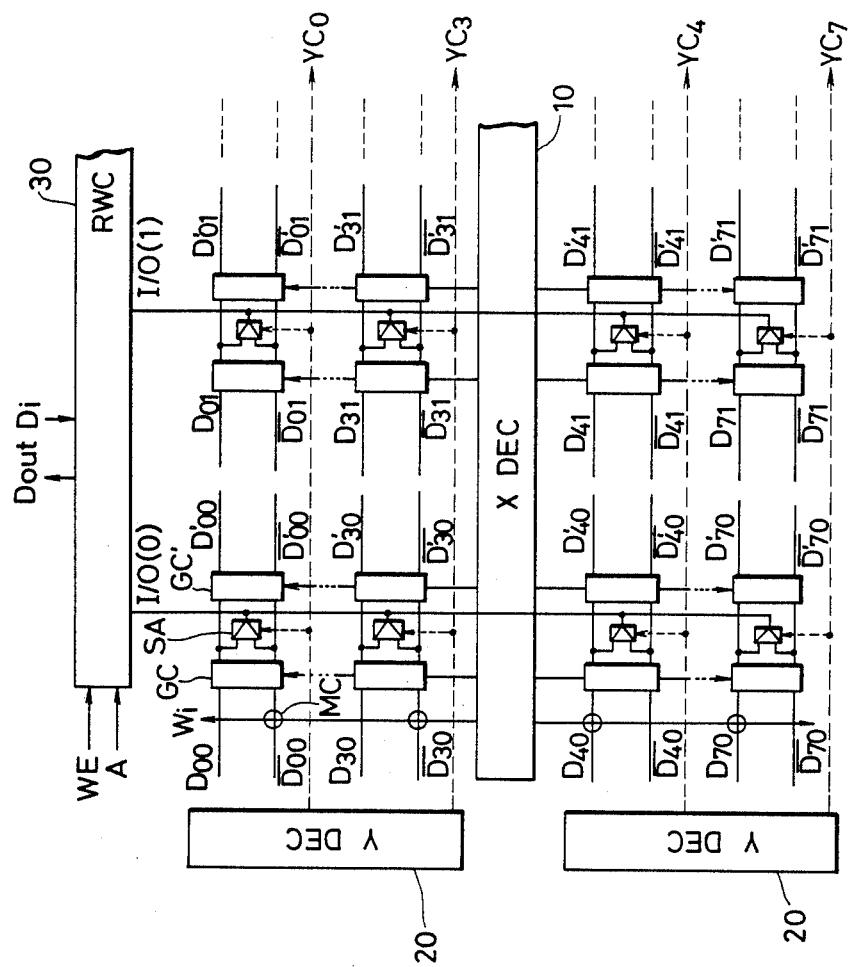
FIG. 6 a detailed circuit diagram of a first preferred form of memory array in a semiconductor memory.

FIG. 6 shows a preferred form of memory array as applied to a semiconductor memory having a folded data line arrangement.

A data line forming each row is divided into, e.g. $D_{00}$ $D_{00}'$, $D_{01}$ and $D_{01}'$. The pair of data lines $D_{00}$ and $\overline{D_{00}}$ are connected to a sense amplifier SA through a switching circuit GC. The pair of data lines $D_{00}'$ and $\overline{D_{00}'}$ are connected to the sense amplifier SA through a switching circuit GC'. Accordingly, the sense amplifier SA is arranged in common to the data pair lines $D_{ij}$, $\overline{D_{ij}}$ and the other data pair lines $D_{ij}'$, $\overline{D_{ij}'}$. A single control line $YC_0$ is arranged in correspondence with data lines $D_{00}$, $D_{00}'$, $D_{01}$, $D_{01}'$ . . . aligned in one row and data lines $\overline{D_{00}'}$, $\overline{D_{00}'}$, $\overline{D_{01}}$, $\overline{D_{01}}$, . . . paired therewith. Control lines $YC_3$, $YC_4$, $YC_7$ etc. are respectively arranged in correspondence with other data pair lines.

Word lines (only one word line $W_i$ being illustrated in FIG. 3) intersecting the data lines are selectively driven by a circuit block 10 which includes an X decoder and a word driver. Only one of the switching circuits GC and GC' is driven by a control signal $\phi_{GC}$ or $\phi_{GC}'$ from the circuit block 10. The information of only one of the memory cells connected with the data lines $D_{00}$, $D_{00}'$, $D_{00}$, and $D_{00}'$ is transmitted to one end of the sense amplifier SA. The information of a dummy cell, not shown, is transmitted to the other end of the sense amplifier SA. Signals are similarly transmitted to other sense amplifiers, and each sense amplifier differentially amplifies the transmitted signals.

All outputs from the sense amplifiers arrayed in the first column are associated with a common input/output line I/O(0). Among these sense amplifiers, only one selected by the circuit block 20 through any of the control lines $YC_0$, $YC_3$, $YC_4$, $YC_7$ etc. has its output applied to the common input/output line I/O(0) and then transmitted to a read/write controller 30. Likewise, the outputs of the sense amplifiers arrayed in the other columns are transmitted to selected common input/output lines I/O(1) etc. The read/write controller 30 is controlled by an address signal A and a write/read control signal WE, and provides a data output $D_{out}$ corresponding to the potential of the desired one of the common input/output lines. A writing operation is similarly performed in such a way that a data input $D_i$ supplied from outside the chip is applied to the selected common input/output line and then to the selected memory cell.

Figure 7A:
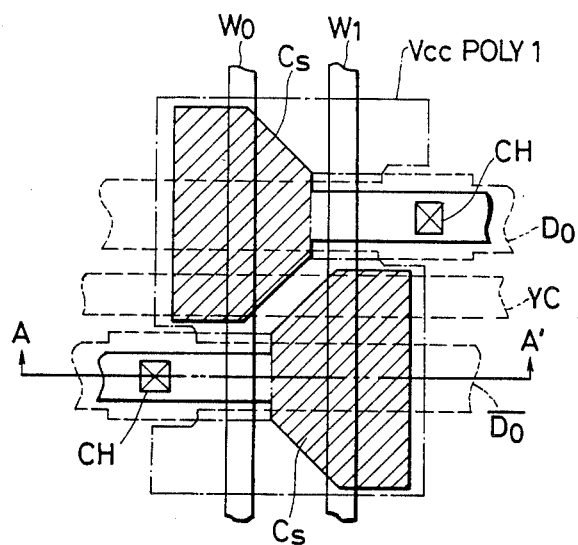
FIGS. 7A, 7B and 7C are respectively a plan view, an equivalent circuit diagram and a sectional view of a memory cell of the memory array shown in FIG. 5.
Figure 7B:
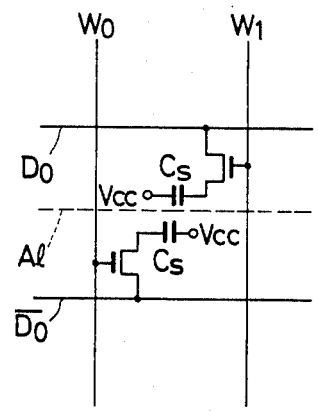
Figure 7C:
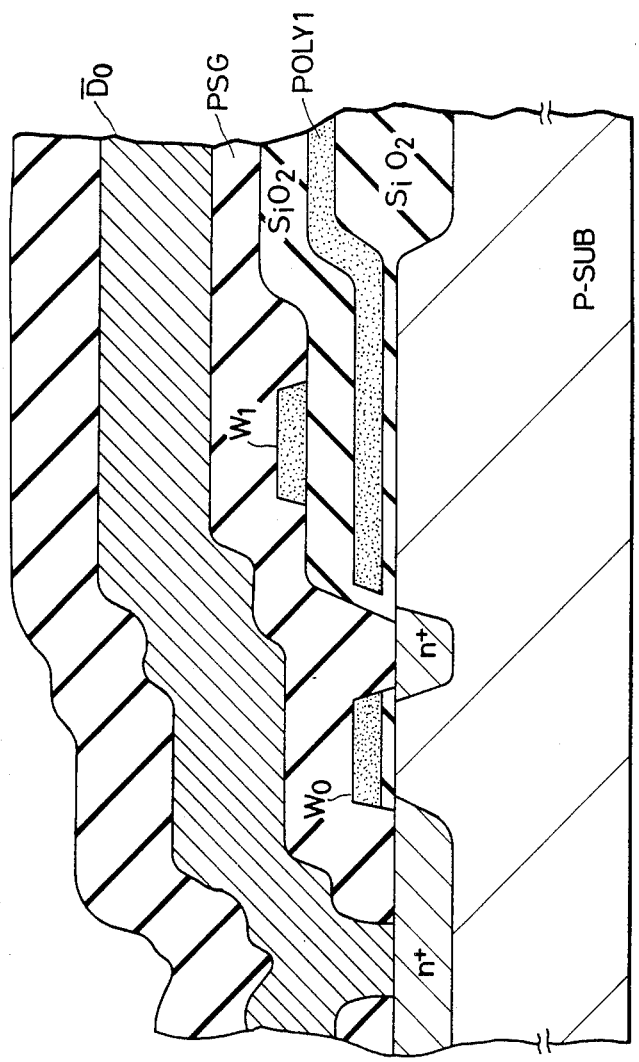

Referring now to FIGS. 7A, 7B and 7C as seen from the equivalent circuit diagram of FIG. 7B, the plan view of FIG. 7A shows only the portion of two memory cells which are respectively connected to the paired data lines $D_0$ and $\overline{D_0}$. The part enclosed with a dot-and-dash line indicates a first layer of polycrystalline silicon POLY I to which a supply voltage $V_{CC}$ is applied. In the part POLY I, hatched areas are parts which are formed on a silicon diode layer thinner than in the other part, and storage capacitances $C_S$ are formed by the hatched parts and a silicon substrate. The word lines $W_0$ and $W_1$ are formed of a second layer of polycrystalline silicon, and parts of them form the gates of MOS transistors. These layers are overlaid with a phosphosilicate glass layer PSG, on which the data lines $D_0$ and $\overline{D_0}$ indicated by broken lines and formed of a first layer of aluminium are formed. A contact area CH is provided for the connection between the aluminium layer and an $n^+$-type diffused layer in the silicon substrate. The first layer of aluminium is overlaid with an inter-layer insulating film, on which the control line YC made of a second layer of aluminium is formed.

As shown in FIG. 7A, the control line YC which is laid between the pair of data lines $D_0$ and $\overline{D_0}$ should desirably be arranged in the middle of these data lines. The reason is that when the control line YC is located nearer to either data line, the data lines $D_0$ and $\overline{D_0}$ come to have unequal capacitances with respect to the control line YC, which gives rise to the generation of noise in the differential reading of signals on the data lines $D_0$ and $\overline{D_0}$.

Figure 8:
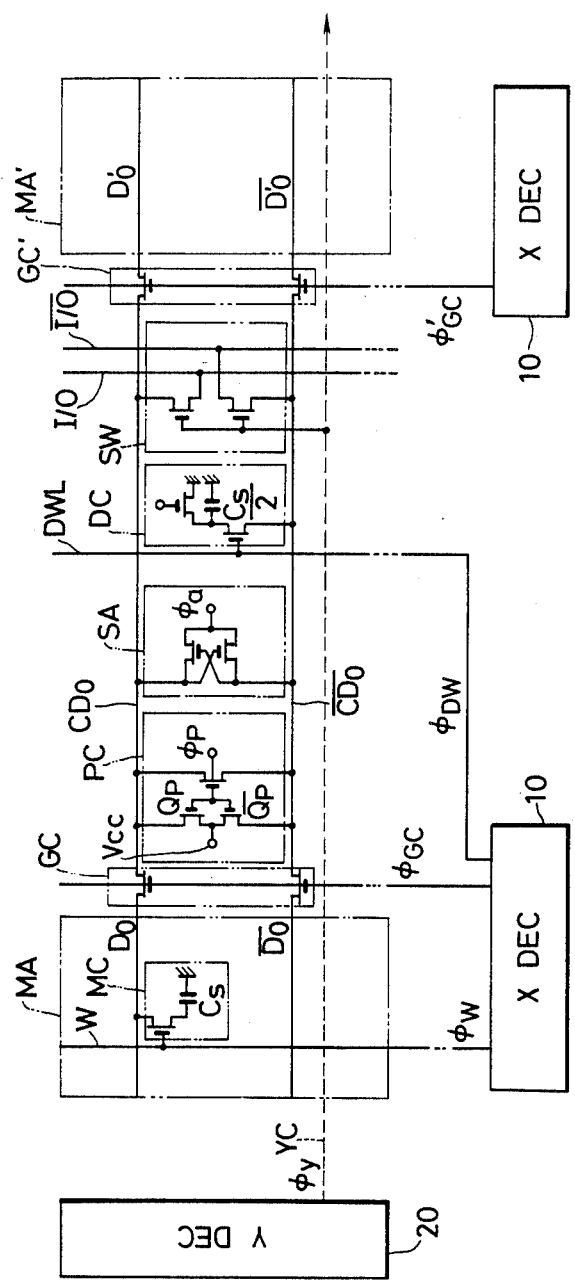
FIG. 8 is a circuit diagram showing a part of the memory array shown in FIG. 6 in greater detail.

FIG. 8 shows the sense amplifier SA in greater detail and the proximate circuits which have been omitted from FIG. 6.

The data lines $D_0$ and $\overline{D_0}$ are connected to nodes $CD_0$ and $\overline{CD_0}$ through the switching circuit GC. The data lines $D_0'$ and $\overline{D_0'}$ are also connected to the nodes $CD_0$ and $\overline{CD_0}$ through the switching circuit GC'. The nodes $CD_0$ and $\overline{CD_0}$ have a precharging circuit PC, the dummy cell DC and a switching circuit SW connected thereto in addition to the sense amplifier SA.

Figure 9:
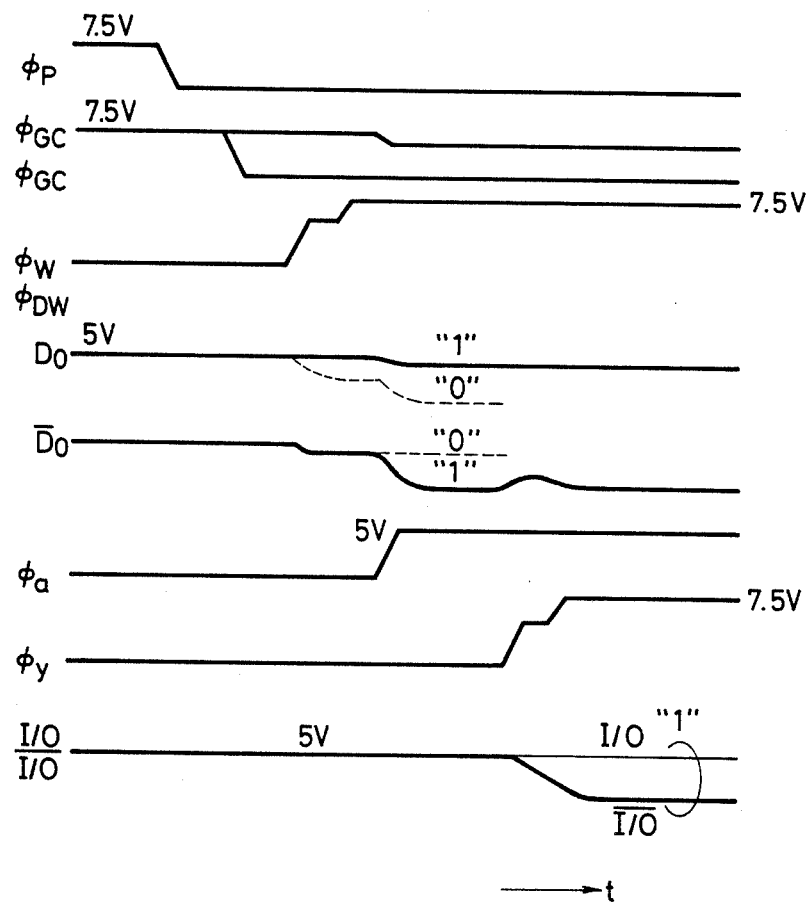
FIG. 9 is a waveform diagram illustrating operations in the circuit shown in FIG. 5.

The operation of the above embodiment will be described in greater detail with reference to the waveforms shown in FIG. 9. First, all of the nodes ($D_0$, $\overline{D_0}$, $CD_0$, $\overline{CD_0}$, $D_0$, $\overline{D_0'}$ etc.) are precharged to a high potential by a precharge signal $\phi_p$, whereupon the word line W is selected by a word pulse $\phi_W$ provided from the X decoder. Then, all the memory cells connected to the word line are selected. By way of example, a minute signal voltage which is determined by the storage capacitance $C_S$ of the memory cell MC and the capacitance of the data line $D_0$ is delievered to this data line $D_0$ corresponding to the memory cell MC. At the same time, a reference voltage is delivered from the dummy cell DC to the node $CD_0$ by turning "on" a pulse $\phi_{DW}$. Before the word line is selected, the switching circuit GC' connected to the data line to which the memory cell to be selected does not belong is turned "off" in such a way that a control signal $\phi_{GC}'$ is brought from the high level at the precharging into a low level. In contrast, the switching circuit GC remains "on". Accordingly, signal voltages corresponding to an information from the memory cell MC appear at $D_0$ and $CD_0$, and the reference voltage from the dummy cell DC appears at $\overline{D_0}$ and $\overline{CD_0}$. Since the capacitance of the dummy cell DC is selected to be one half that of the storage capacitance $C_S$ of the memory cell MC, the reference voltage is set to be intermediate between the read-out voltages which appear at $D_0$ and $CD_0$ in correspondence with the information "1" and "0" of the memory cell MC. At the input terminals of the sense amplifier SA, therefore, minute fluctuating voltages corresponding to the information "1" and "0" appear at all times. Thereafter, the sense amplifier SA is operated by a start pulse $\phi_a$ so as to amplify the differential voltages. Thereafter, a control signal $\phi_y$ is delivered to the control line YC selected by the Y decoder Y DEC, and the amplified differential voltages are differentially applied onto the pair of common input/output lines I/O and $\overline{I/O}$ via the switch SW.

Important features of the above described circuit arrangement are:

(a) that the common input/output lines are located between the memory arrays MA and MA' not on one side of each memory array, so the reading and writing operations can be performed fast, and (b) that since the precharging circuit PC and the dummy cell DC are made common to the two memory arrays MA and MA' the required area decreases accordingly.

Of course, these circuits can be arranged for the respective memory arrays MA and MA' as in the prior art without being made common. In FIG. 6, the supply voltage $V_{CC}=5$ volts by way of example, and the signals $\phi_P$, $\phi_{GC}$ and $\phi_{GC}'$ are set at 7.5 volts in order to apply a sufficiently high voltage so that the data lines $D_0$ and $\overline{D_0}$ may be precharged with equal voltages. The signals $\phi_W$ and $\phi_{DW}$ are set at 7.5 volts in order to make the read-out voltage from the memory cell high by boosting the word line to 7.5 volts with a capacitor. The signal $\phi_y$ is set at 7.5 volts in order to raise the mutual conductances $g_m$ of the MOS transistors within the switching circuit SW so that the signals may be delivered from the nodes $CD_0$ to $\overline{CD_0}$ the common input-/output lines I/O and $\overline{I/O}$ at high speed.

Figure 10:
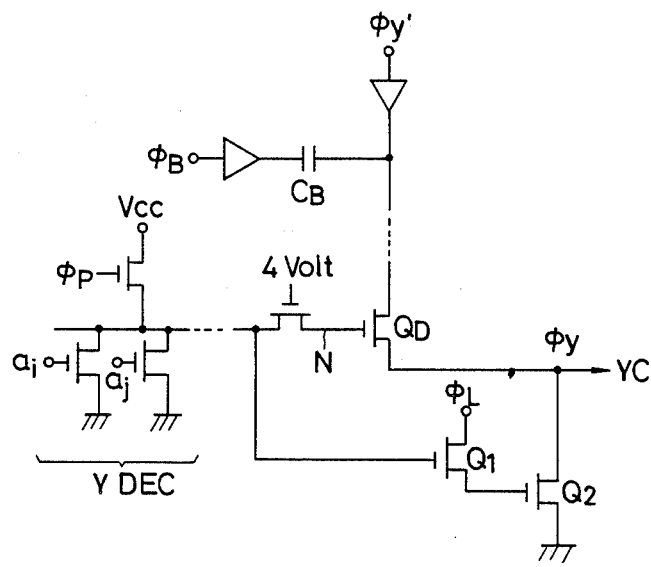
FIGS. 10 and 11 are respectively a circuit diagram showing a part of the circuit shown in FIG. 5 in greater detail and a waveform diagram illustrating the operation thereof.
Figure 11:
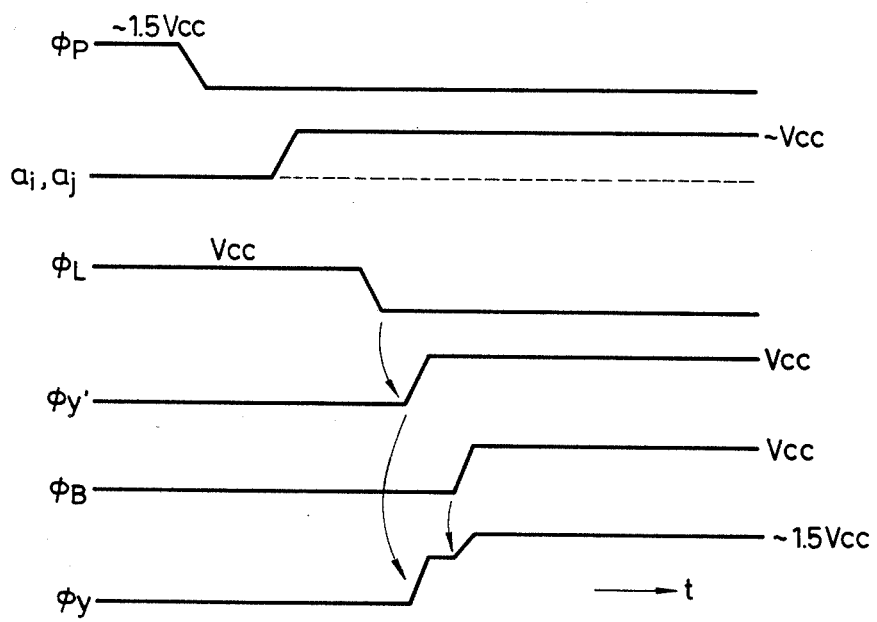

That portion in the circuit block 20 which produces the control signal $\phi_y$ boosted to 7.5 volts with respect to the supply voltage $V_{CC}$ of 5 volts is illustrated in FIG. 10, whilst waveforms in various parts of the portion are shown in FIG. 11.

When the Y decoder Y DEC precharged to the supply voltage $V_{CC}$ by the signal $\phi_p$ has been selected, decoding MOS transistors remain in the "off" states, and a node N remains at the high level, so that a MOS transistor $Q_D$ holds the "on" state. Under this condition, a pulse $\phi_y'$ indicative of the timing of the generation of the control signal $\phi_y$ is provided and applied to the control line YC through the MOS transistor $Q_D$. A boosting signal $\phi_B$ is subsequently applied through a capacitance $C_B$, whereby the voltage of the control line YC is boosted to produce a waveform as shown by the signal $\phi_y$. MOS transistors $Q_1$ and $Q_2$ constitute a circuit which keeps the control line YC connected to earth potential with a low impedance when this control line is non-selected, in order to prevent the potential of the non-selected control line from rising due to any unnecessary coupled voltage.

Figure 12A:
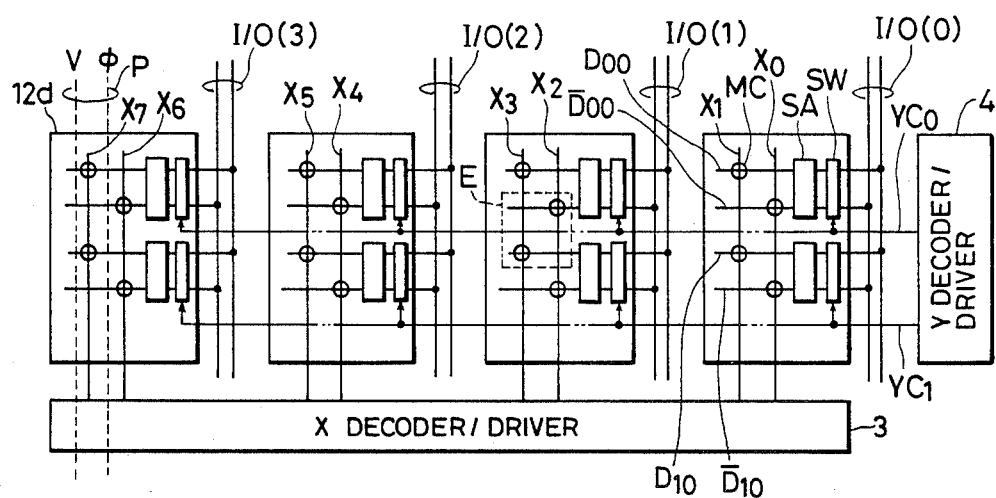
FIGS. 12A to 13 and 16 are diagrams each showing the arrangement of other embodiments of the present invention.

FIG. 12A shows an example in which a large number of sub arrays 12a–12d are driven by a single Y decoder and the wiring leads P are arranged within the sub array 12d.

Each of the sub arrays is constructed of folded bit line arrangement cells. One of the word lines $X_0$–$X_7$ of the respective sub arrays is selected by an X decoder 3 (including a driver). Each of the sub arrays 12a–12d is provided with one pair of input/output lines I/O. When note is taken of the sub array 12a, the signal of the memory cell MC connected to the word line $X_0$ selected by the X decoder 3 appears on a sub data line $D_{00}$. After the signals of a sub data line pair $D_{00}$, $\overline{D_{00}}$ have been differentially amplified by a sense amplifier SA, a switch SW is driven by means of a Y control line $YC_0$ selected by the Y decoder 4, and the amplified signals are read out on one pair of input/output lines I/O(0). The other sub arrays 12b–12d have similar arrangements. The switches SW of the respective sub arrays are driven by common Y control lines $YC_0$ and $YC_1$. For example, in a case where the Y control line $YC_0$ has been selected, the signals of one sub data line pair are read out from each of the sub arrays 12a–12d to the corresponding one of the input/output lines I/O(0) –I/O(3).

In the present embodiment, the wiring leads P which consists of the power source line for feeding a supply voltage V and the signal lines of various timings (in the figure, only $\phi$ is illustrated), are formed by the same conductor layer as that of the Y control lines $YC_0$, $YC_1$. Accordingly, in order to prevent the wiring leads P and the Y control lines from overlapping, the switches are disposed on the side of the sub array 12d near to the Y decoder 4, whereby the Y control lines parallel to the sub data lines are prevented from extending deep into the sub array 12d. Thus, the wiring leads P which orthogonally intersect the sub data lines can be arranged within the sub array 12d.

Figure 12B:
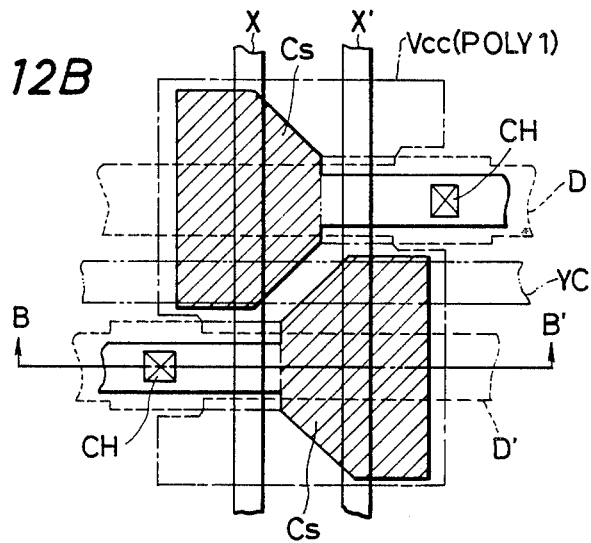
Figure 12C:
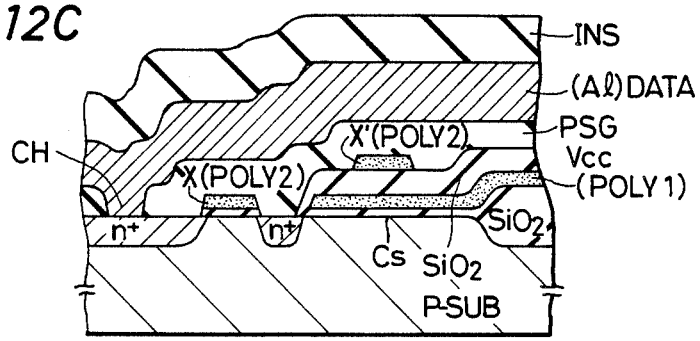

FIG. 12B is a layout pattern of the part E of FIG. 5A enclosed with a dotted line. FIG. 12C is a sectional view taken along line B—B' in FIG. 12B.

The storage capacitance $C_s$ of the memory cell, which is a hatched part in FIG. 12B, is formed between a first layer of polycrystalline silicon (POLY1 in FIG. 5C) and a p-type substrate pSUB with a thin oxide film $SiO_2$ held therebetween. The data line D' is formed of a first layer of aluminum which is connected with a diffused layer n+through a contact hole (CH in the figures). Symbol INS in FIG. 12C denotes a inter-layer insulator film which is located between the data line D' and the Y control line YC. The word lines X are formed of a second layer of polycrystalline silicon (POLY2). Further, broken lines in FIG. 12B indicate the data lnes. Indicated by a two-dot chain line is the Y control line, which is formed of a second layer of aluminum that lies over the first layer of aluminum. The wiring leads P are formed of the second layer of aluminum likewise to the Y control lines.

Figure 12D:
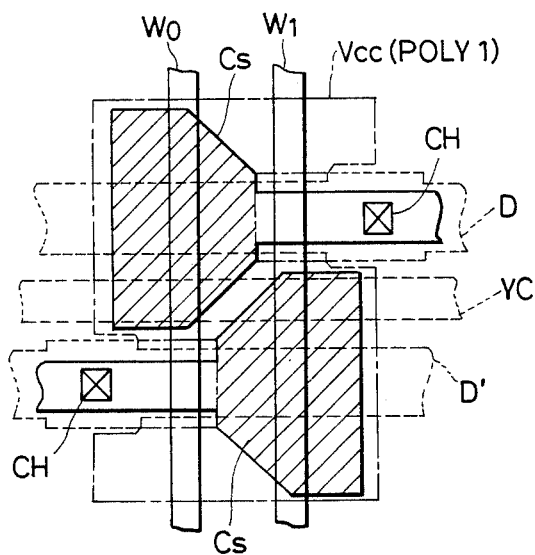

FIG. 12D is a diagram of another layout of the part E of FIG. 12A enclosed with the dotted line. The difference from FIG. 5B is that the sub data lines D, D' and the Y control line YC are formed of the same conductor layer or the first layer of aluminum. In the figure, therefore, the sub data lines D, D' and the Y control line YC are indicated by the same dotted lines. Since the sub data lines and the Y control lines are arranged in parallel and do not overlap each other, they can be formed of the same conductor layer. In this case as in the layout of FIG. 12B, the wiring leads P are formed of the second layer of aluminum, and the word lines are formed of the self-alignment material such as polycrystalline silicon.

According to the layout of FIG. 12D, the wiring leads P orthogonally intersecting the sub data lines and the Y control lines extending in parallel therewith are not of the same conductor layer, the wiring leads P can be arranged using the entire region on the sub array When the power source line and various timing signal lines are formed of the second layer of aluminum, the X decoder is recommended to be laid out by the use of the first layer of aluminum. This measure facilitates the layout because it is free from the trouble of changing the connection of the power source line and various timing signal lines to another conductor layer in the X decoder portion and then passing the lines within the X decoder.

Figure 13:
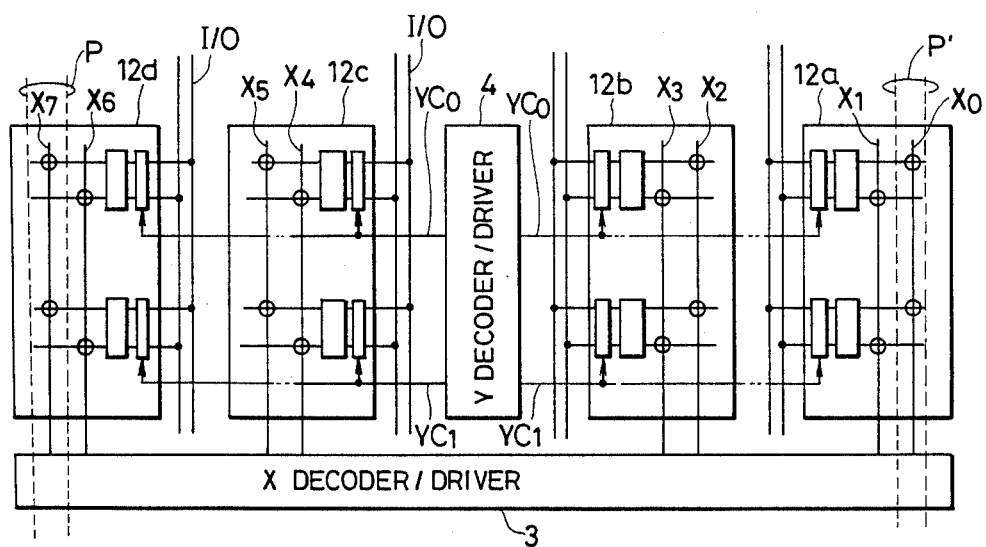

FIG. 13 shows an embodiment which has improved the circuit arrangement of FIG. 12A. The same parts as in FIG. 12A are assigned the same symbols.

The point of difference from the circuit arrangement in FIG. 12A is that the Y decoder 4 is arranged between the sub arrays, and that the Y control lines $YC_0$, $YC_1$ are extended bidirectionally so as to drive the sub arrays on both the sides of the Y decoder. In order to balance the Y control lines, the numbers of the sub arrays on both the sides are equalized.

In the present embodiment, not only the sub array 12d, but also the sub array 12a is provided with the space in which the power source line $V_{CC}$ and various timing signal lines P' are arranged without passing the Y control lines $YC_0$, $YC_1$. In the case of forming the Y control lines and the wiring leads P by the use of the same conductor layer, therefore, the present embodiment can furnish the power source and timing signal lines with an area double that of the circuit arrangement in FIG. 12A.

Figure 14:
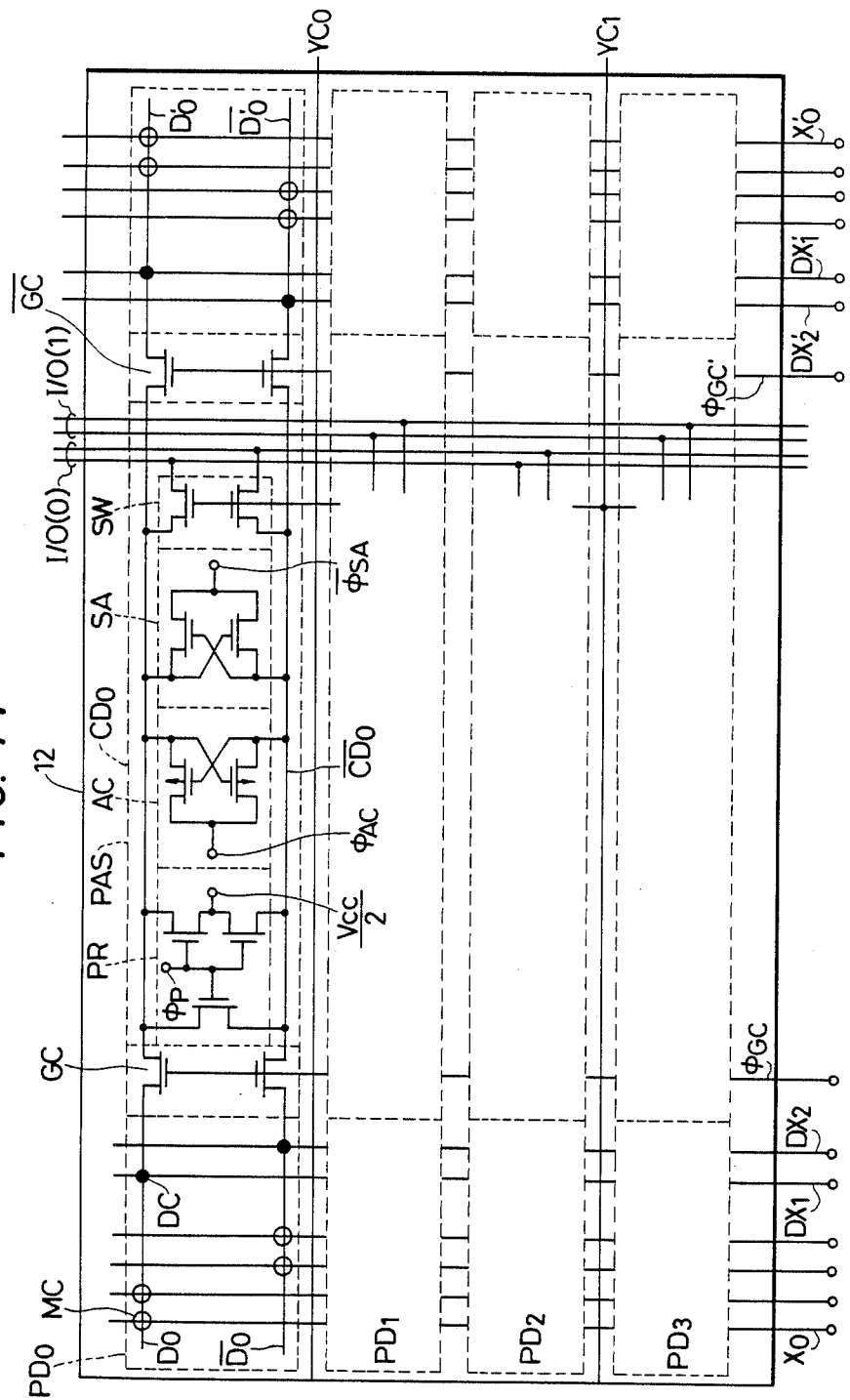

FIG. 14 shows an embodiment which has improved the sub arrays of the circuit arrangements in FIG. 12A and FIG. 13.

Data lines $D_0$, $\overline{D_0}$ are connected to nodes $CD_0$, $\overline{CD_0}$ through a switching circuit GC. Data lines $D_0'$, $\overline{D_0}'$ are also connected to the nodes $CD_0$, $\overline{CD_0}$ through a switching circuit $\overline{GC}$. A sense amplifier SA, an active restore circuit AC, a precharge circuit PC and a switching circuit SW are connected to the nodes $CD_0$, $\overline{CD_0}$. In the figure, four sets of circuits PD ($PD_0$, $PD_1$, $PD_2$ and $PD_3$) in each of which they are combined are shown.

Figure 15:
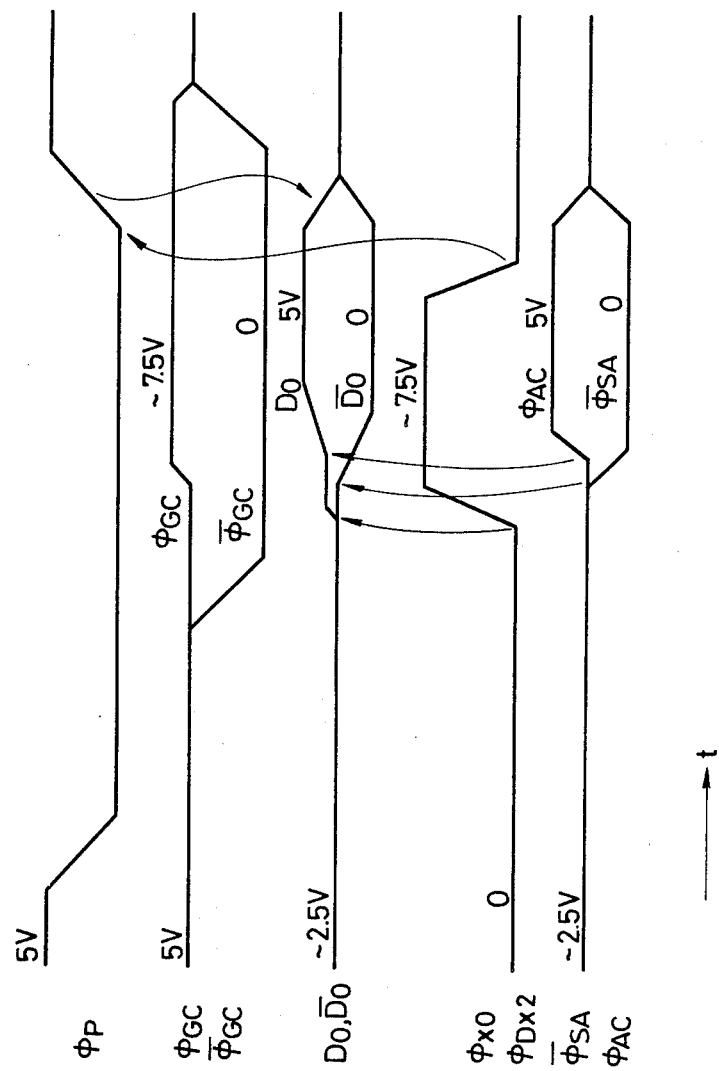
FIG. 15 is a time chart of the operation of the sub-array in FIG. 14.

The embodiment will be described more in detail with reference to a time chart in FIG. 15. First, in accordance with a precharge signal $\phi_p$, the precharge circuit PC precharges charges all the nodes ($D_0$, $\overline{D_0}$, $CD_0$, $\overline{CD_0}$, $D_0'$, $\overline{D_0}'$, etc.) to $\frac{1}{2}$ $V_{CC}$. This is called the "half precharge". When a word line $X_0$ is selected by an X decoer (not shown) to provide a word pulse $\phi_{xo}$, a memory cell MC connected thereto is selected. Thus, a minute signal voltage which is determined by the storage capacitance $C_s$ of the memory cell MC and the capacitance of the data line $D_0$ is delivered to this data line.

Simultaneously, a reference voltage is delivered from a dummy cell DC to the data line $\overline{D_0}$ by turning on a pulse $\phi_{DX2}$. The dummy cell DC is not especially needed in the half precharge system, but the use thereof is more effective when it is desired to cancel noise components.

Before the word line $X_0$ is selected, the switching circuit $\overline{GC}$ connected to the data lines ($D_0'$, $\overline{D_0}'$) on the side to which the memory cell MC to be selected belongs is turned off by a control signal $\overline{GC}$. On the other hand, the switch GC remains turned on. Accordingly, signals corresponding to the information from the memory cell MC appear at the nodes $\overline{D_0}$, $\overline{CD_0}$, while the reference voltage from the dummy cell DC appears at the nodes $\overline{D_0}$, $\overline{CD_0}$. The reference voltage is set at substantially the intermediate potential between read voltages which appear at the node $CD_0$ in correspondence with the information "1" and "0" of the memory cell MC. Therefore, a minute differential voltage corresponding to the information "1" or "0" appears at the input end of the sense amplifier SA. Thereafter, the sense amplifier SA is operated by a start pulse $\phi_{SA}$ so as to amplify the differential voltage. Since the sense amplifier SA is formed of n-channel MOSFETs, it cannot charge the node $CD_0$ or $\overline{CD_0}$ though it can discharge the same. Therefore, the active restore cirucit AC is operated by a start pulse $\phi_{AC}$ so as to perform the charging. To this end, the active restore circuit AC is formed of p-channel MOSFETs.

Thereafter, a control signal is delivered to the Y control line $YC_0$ selected by a Y decoder (not shown), and the amplified voltage is differentially delivered to paired common input/output lines I/O(0) via the switch SW. Input/output lines I/O(0), I/O(1) are formed of the same conductor layer as that of the power source line or various timing signal lines.

The merits of the present circuit arrangement are as follows. Since the common input/output lines are laid near the sense amplifier SA, data can be read and written at high speed. In addition, since the precharge circuit, sense amplifier and active restore circuit are common to the two data line pairs, the area decreases to that extent.

Figure 16:
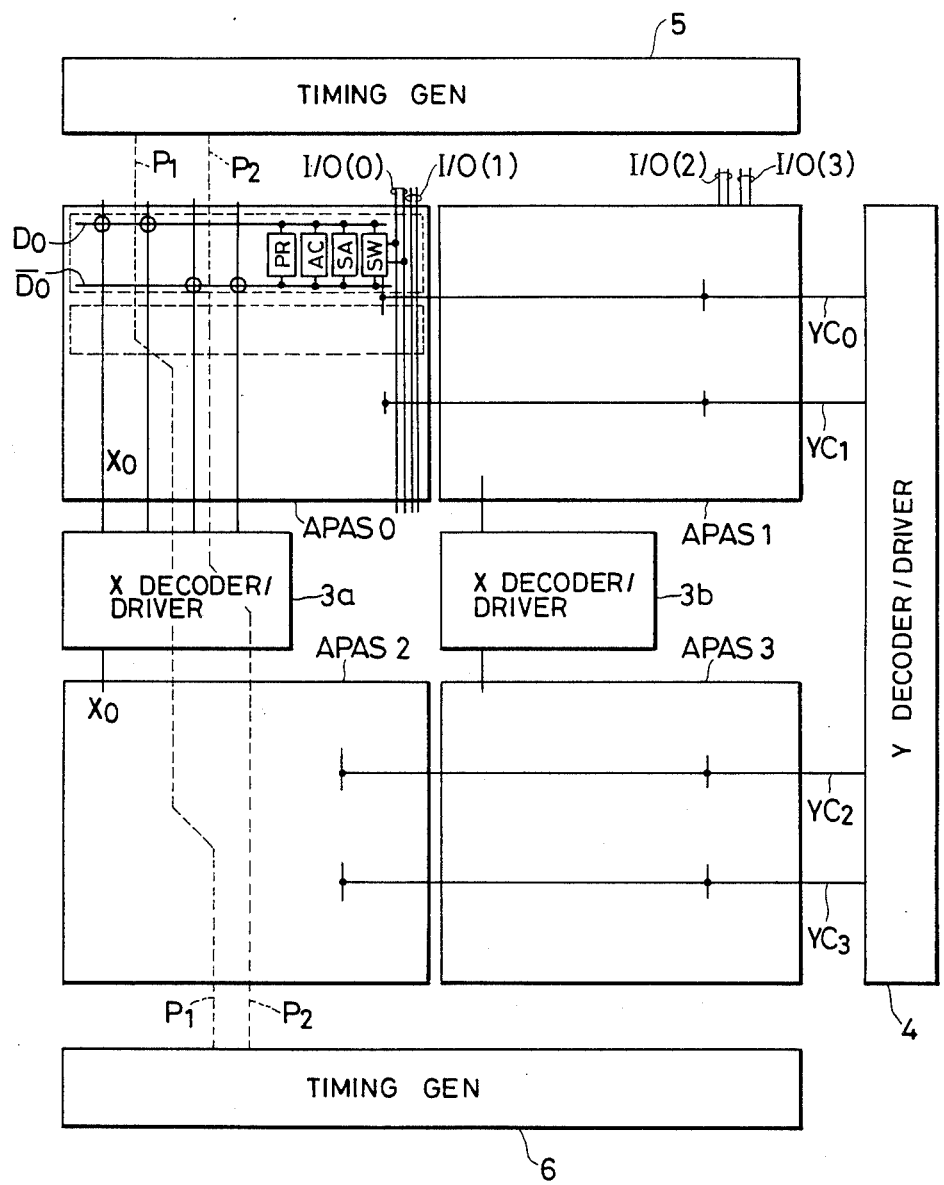

FIG. 16 shows an example in which the word lines are divided into sub word lines as to the two sub arrays 12a and 12b of the circuit arrangement in FIG. 12A.

The sub array 12a in FIG. 5A is divided into arrays APAS0 and APAS2 in the lengthwise direction of the word lines, and the other sub array 12b into arrays APAS1 and APAS3. X decoders 3a and 3b are disposed between the respective divided arrays.

The memory is composed of the folded bit line arrangement cells as shown in FIG. 14. However, in the circuit arrangement of FIG. 14, the single sense amplifier SA, precharge circuit PR, active restore circuit AC and switch SW are shared by the two pairs of data lines, whereas in the present embodiment, a single sense amplifier etc. are employed for one pair of data lines. Accordingly, the present embodiment differs from the circuit arrangement of FIG. 14 in that the switching circuits GC, $\overline{GC}$ are not comprised, but it is the same in regard to the other circuits.

Timing signal lines $P_1$, $P_2$ between timing generator circuits 5 and 6 for generating various timing signals are formed of the second layer of aluminum similarly to Y control lines $YC_0$-$YC_3$ extended from a Y decoder 4.

Since, in the present embodiment, the folded bit line arrangement cells are employed, the switches SW are disposed on one side of the arrays nearer to the Y decoder 4. Accordingly, the Y control lines $YC_0$-$YC_3$ from the Y decoder 4 are extended to intermediate positions of the outer arrays APAS0, APAS2 as viewed from the Y decoder 4 and are connected to the switches SW. The timing signal lines between the timing generator circuits can therefore be arranged in the remaining regions of the arrays APAS0, APAS2.

The timing signal lines $P_1$, $P_2$ are arranged so as to couple with a plurality of sub word lines to the end of avoiding the influence of a malfunction ascribable to the capacitive coupling with the sub word line, as illustrated in FIG. 3. By way of example, the timing signal line $P_1$ is bent within the array so as to be also coupled with another word line, while the timing signal line $P_2$ is bent between the arrays so as to be also coupled with another sub word line.

In the arrangement of FIG. 16, only some of the four arrays APAS0-APAS3 are sometimes operated at the same time without operating all of them. This includes the following two cases:

(1) By driving the X decoder 3a and the Y decoder 4, the arrays in the direction of the sub word lines, such as the arrays APAS0 and APAS2, are operated.

In this case, the voltage fluctuations of the data lines existing directly below the timing signal lines $P_1$, $P_2$ take place over the full lengths of the timing signal lines, so that great noise voltages are induced on the timing signal lines $P_1$, $P_2$ through the coupled capacitances between the timing signal lines and the data lines.

(2) The upper or lower sub word lines of the X decoders 3a and 3b are separately driven, whereby the sub arrays in the direction of the data lines, such as the arrays APAS0 and APAS1, are operated.

In this case, the voltage fluctuations of the data lines existing directly below the timing signal lines $P_1$, $P_2$ take place in only a half of the region in the above case, so that noise voltages decrease to half.

In case of driving some of the arrays, accordingly, it is preferable to operate the sub arrays in the direction of the data lines.

In the arrangement of FIG. 16, the Y control lines $YC_0$-$YC_3$ and the data lines may be made of the first layer of aluminum, and the timing signal lines $P_1$, $P_2$ the second layer of aluminum.

Figure 17:
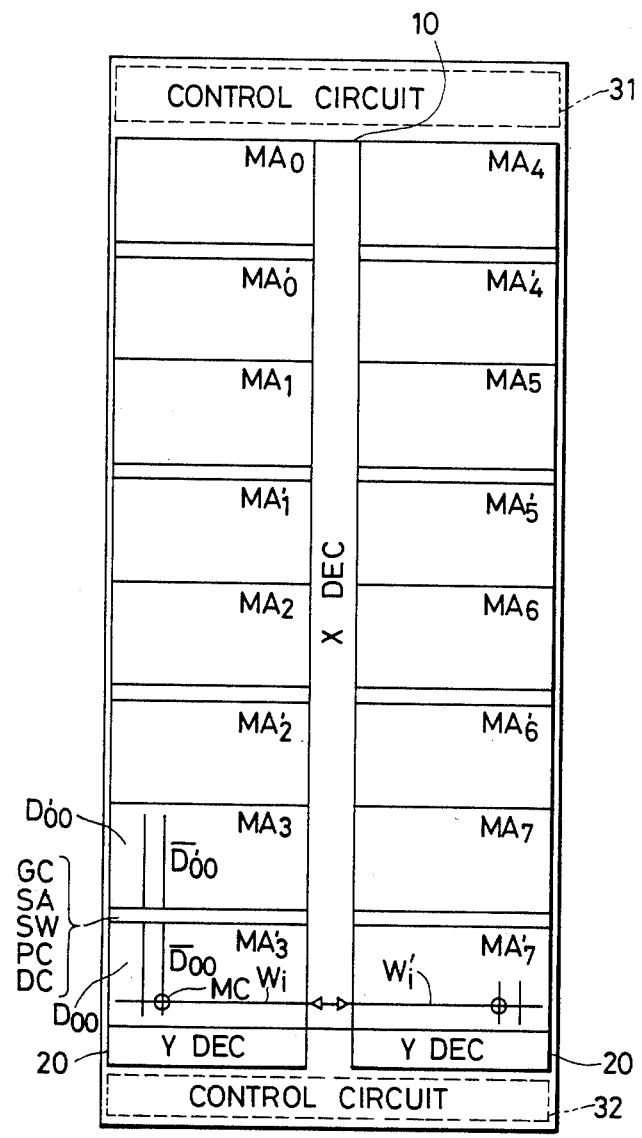
FIG. 17 is a plan view of a chip for the memory array shown in FIG. 3.

Referring now to FIG. 17, the chip is in the shape of an elongated rectangle so that it may be readily received in a standard DIP (Dual In-Line Package). The direction of the divided data lines $D_{00}$, $D_{00}'$ etc. agrees with the lengthwise direction of the chip. The circuit block 10 including the X decoder is arranged centrally of the chip, and on both the sides thereof, the memory arrays $MA_0$, $MA_0'$, $MA_1$, $MA_1'$ etc. divided by the division of the data lines are arranged in alignment. The circuit blocks 20 including the Y decoders are each arranged on one side of the alignment of the memory arrays. The control circuits 31 and 32 are arranged in the remaining parts.

Figure 18:
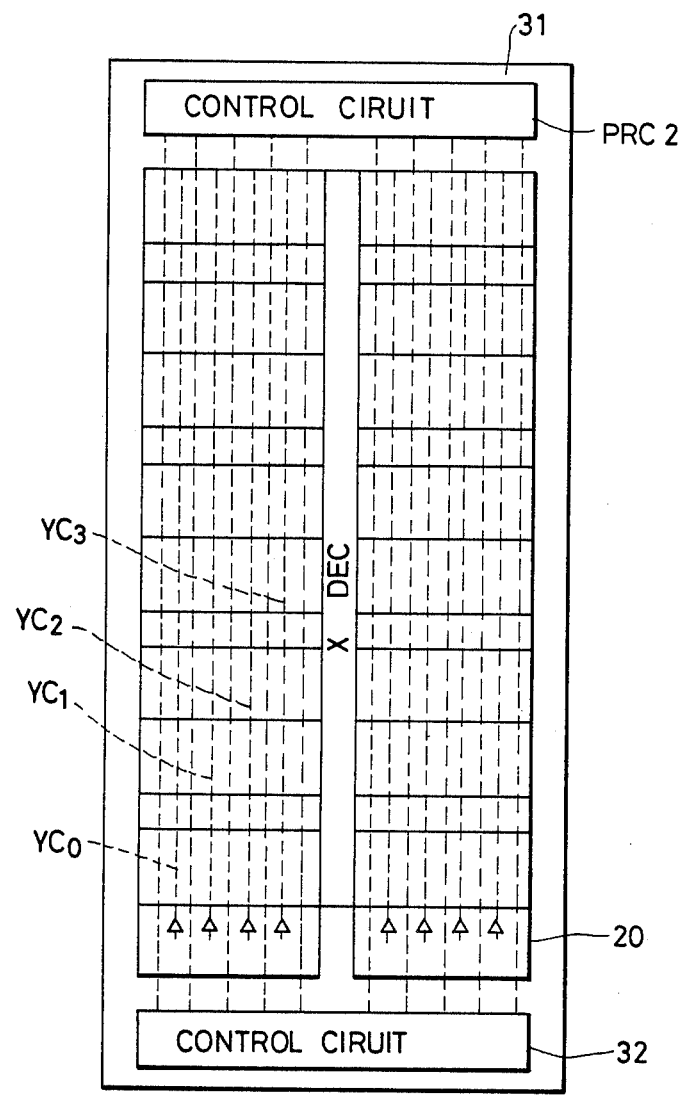
FIG. 18 is a plan view showing another chip.

The control lines YC are laid from the circuit blocks 20 including the Y decoders, so as to extend across the memory cells. In the case where the spacing between the adjacent control lines has room as in embodiments to be described later, different wiring lines from the control circuits 31 and 32 can be formed of the same layer as that of the control lines YC as illustrated in FIG. 18.

Figure 19:
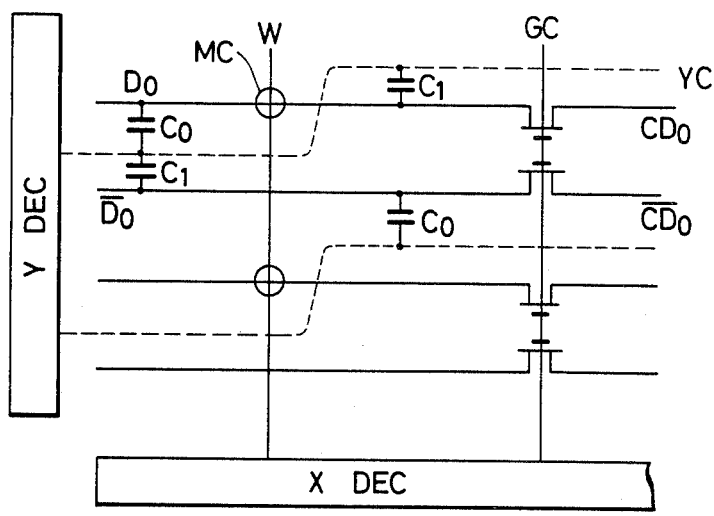
FIGS. 19 to 29 are circuit diagrams and waveform diagrams showing other embodiments and illustrating the operation thereof.

Referring now to a modified embodiment shown in FIG. 19, it should be noted from what has been said previously that the control line YC is preferably arranged in the middle of the data lines $D_0$ and $\overline{D_0}$ in order to avoid the difference of the capacitances of these data lines. In this regard, however, the control line YC and the data lines $D_0$, $\overline{D_0}$ are formed of different layers. Therefore, the misregistration of masks involved in manufacturing steps incurs unequal capacitances of the lines $D_0$ and $\overline{D_0}$, which form a noise source.

As shown in FIG. 19, therefore, the control lines YC are formed so as to intersect over the middle parts of the divided data lines $D_0$ etc. According to such a construction, even when the mask misregistration has occurred in the manufacturing steps, both the data lines $D_0$ and $\overline{D_0}$ can have equal capacitances of $(C_0 + C_1)$.

Figure 20:
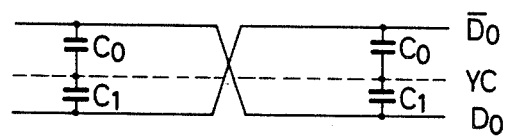

It is possible to realize various other structures in which even in the presence of the mask misregistration, no difference occurs between the capacitances of the paired data lines as described above. FIG. 20 shows an example in which the data line $D_0$ and $\overline{D_0}$ intersect each other in their middle parts.

Figure 21:
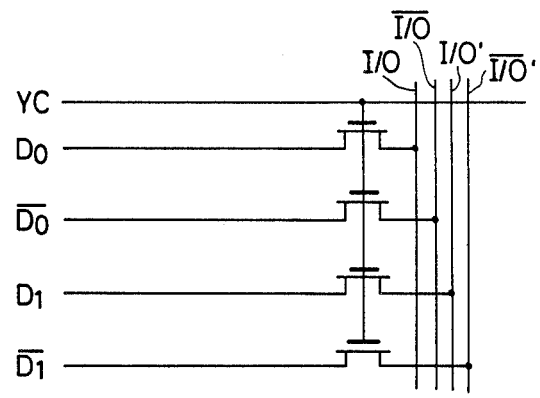
Figure 22:
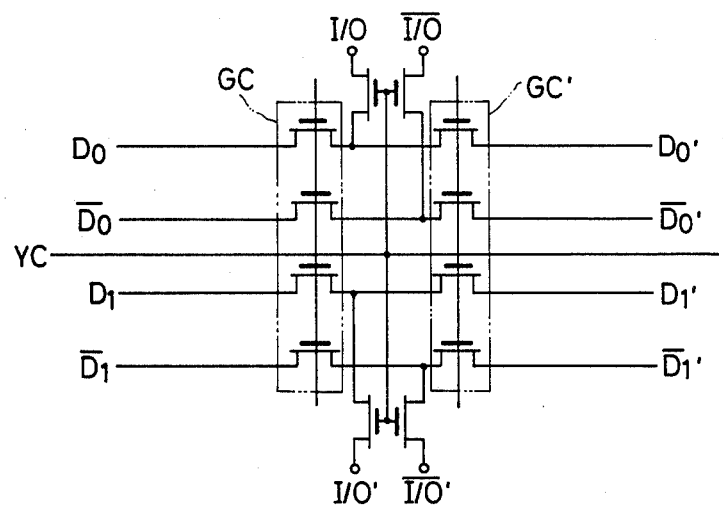

In any of the foregoing embodiments, one control line is arranged in correspondence with the paired data lines. In order to reduce the number of control lines, a construction in which one control line is arranged for two pairs of data lines is also realisable. FIG. 21 shows the general circuit arrangement of such an embodiment, whilst FIG. 22 shows an embodiment in the case where the switching circuits GC and GC' as shown in FIG. 3 are jointly used.

Figure 23:
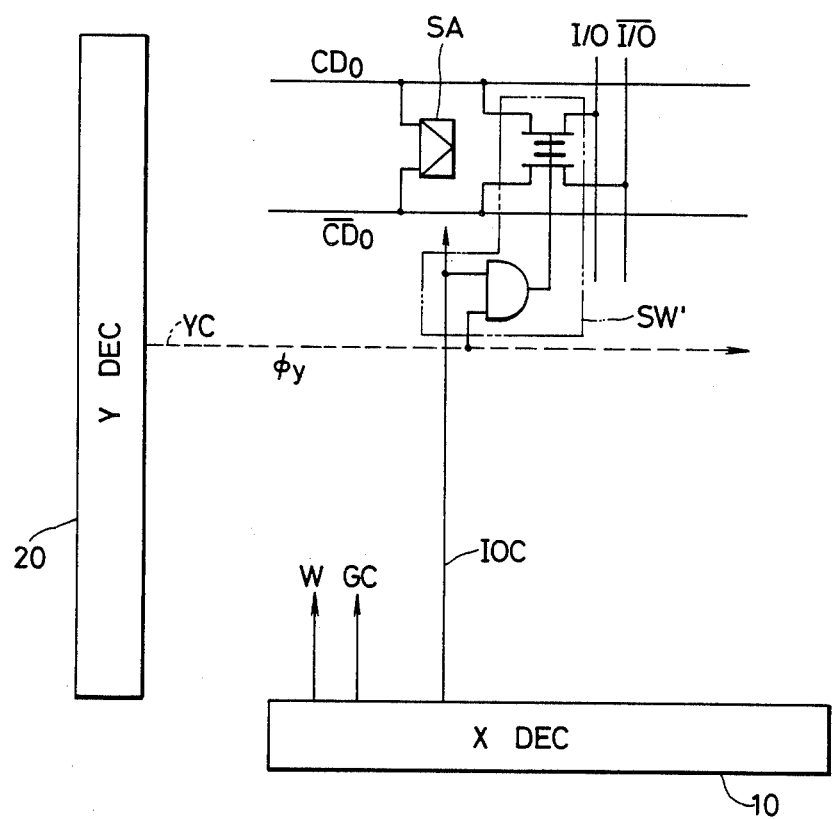

FIG. 23 shows an embodiment in which the portion of the switching circuit SW in the embodiment shown in FIGS. 8, 12A and 13 is modified. The modified switching circuit SW' is controlled by the control line YC and a control line IOC extending from the X decoder 10. Since only the switching circuit SW' existing at the intersection point of the selected lines X and Y turns "on", outputs can be selectively delivered to the lines I/O(0), I/O(1) etc. in FIG. 6. This signifies that the lines I/O(0), I/O(1) etc. can be decoded in advance. Therefore, a simplified circuit can be adopted for the read/write controller 30.

Figure 24:
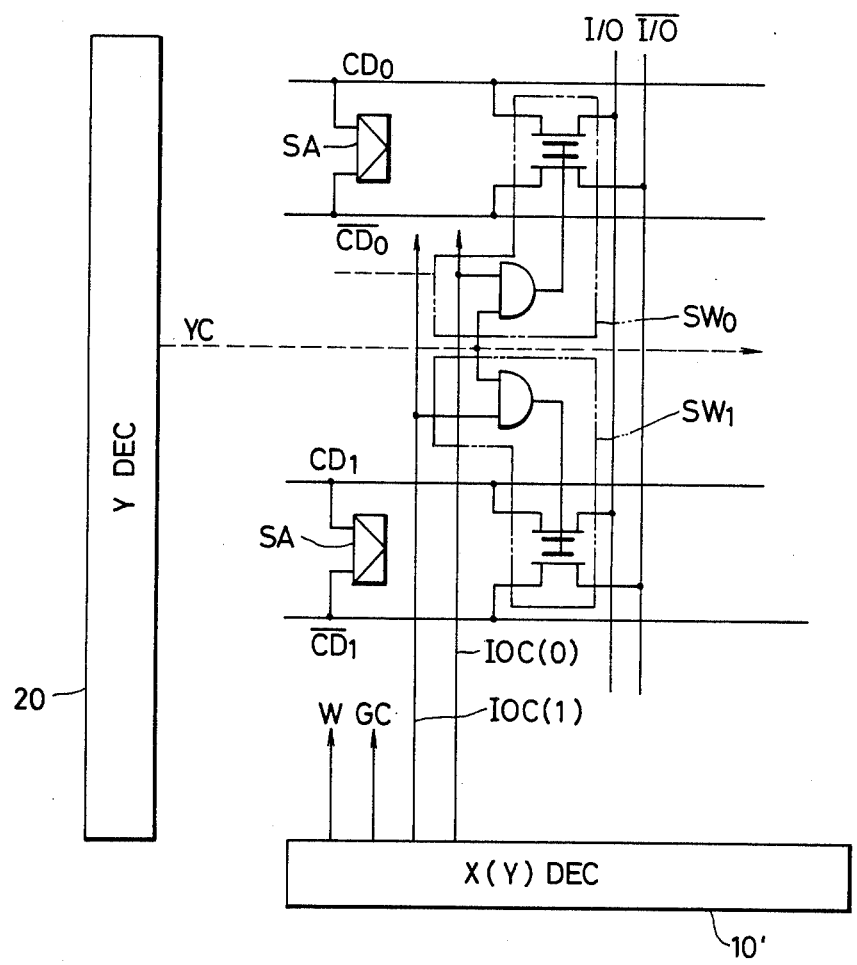

FIG. 24 shows an example in which, by expanding the idea of the embodiment shown in FIG. 23, the control line YC is arranged in correspondence with two pairs of data lines, not each pair of data lines. Thus, the number of wired control lines YC becomes half, that is, the wiring pitch is twice as great as the previous embodiments, so that the manufacture is facilitated. In operation, the switching circuit $SW_0$ or $SW_1$ turns "on" only when the signal from the control line IOC(0) or IOC(1) and the signal from the control line YC have coincided. However the embodiment shown in FIG. 24, differs from the embodiment shown in FIG. 23 in that the signal of the control line IOC(0) or IOC(1) includes an information of a Y-system address signal besides that of an X-system address signal. That is, when the pair of the data lines $D_0$ and $\overline{D_0}$ is selected, the line IOC(0) is selected by the X(Y) decoder 10', and when the pair of the data lines $D_1$ and $\overline{D_1}$ is selected, the line IOC(1) is selected (usually a signal "1" is provided). Needless to say, the above referred to X- and Y-system address signals simply signify X and Y in the arrangement of two-dimensional points in a plane, and they should be discriminated from the logic addresses of the memory.

While the control line YC is arranged in correspondence with the two pairs of data lines, it is needless to say that each control line YC can be arranged in correspondence with any desired number of pairs of data lines.

Figure 25:
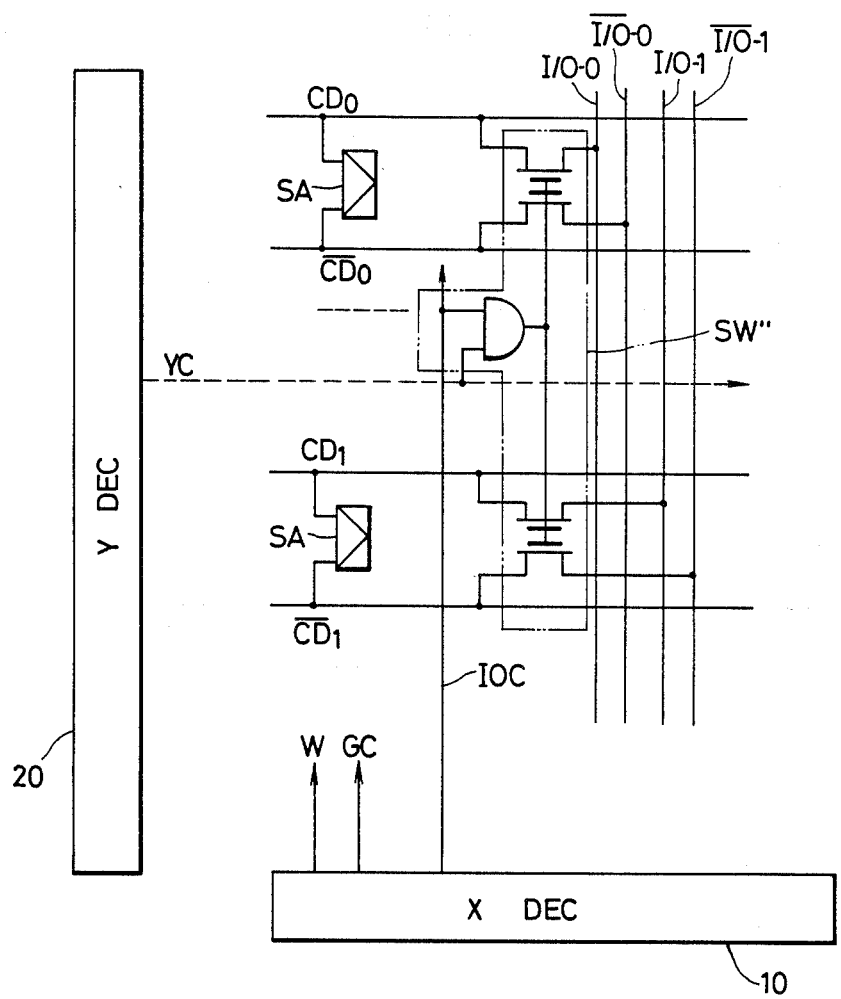

FIG. 25 shows another embodiment in which the wiring pitch of the lines YC is enlarged, for example, twice as great as in the case of FIG. 24. Two sets of I/O lines are provided, and the lines I/O-0 and $\overline{I/O-0}$ are connected to the lines $CD_0$ and $\overline{CD_0}$ and the lines I/O-1 and $\overline{I/O-1}$ to the lines $CD_1$ and $\overline{CD_1}$ by a switching circuit SW''', respectively, so as to exchange signals with the exterior. The two sets of I/O lines have either selected and connected with the line $D_i$ or $D_{out}$ by the read/write controller 30 shown in FIG. 2. Alternatively, it is possible to provide a plurality of lines $D_i$ or $D_{out}$ and to directly connect the I/O lines therewith without performing the selecting operation.

With the present embodiment, as in the embodiment of FIG. 24, the wiring pitch of the control lines YC can be enlarged thus facilitating the manufacture.

Figure 26:
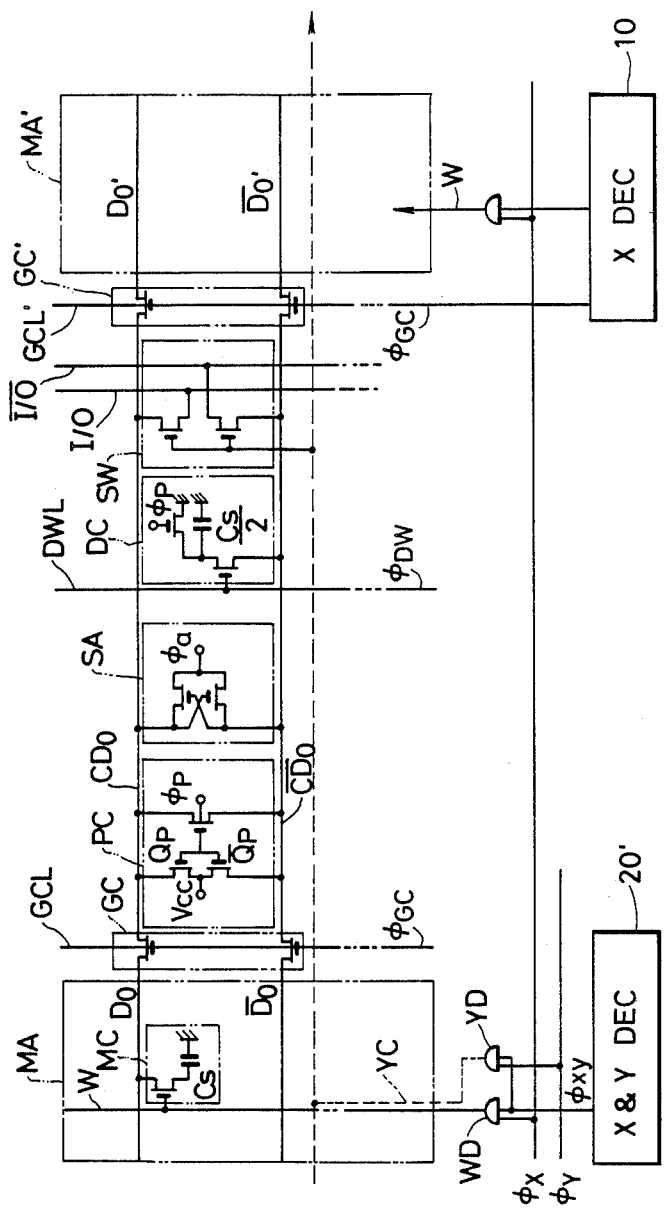
Figure 27:
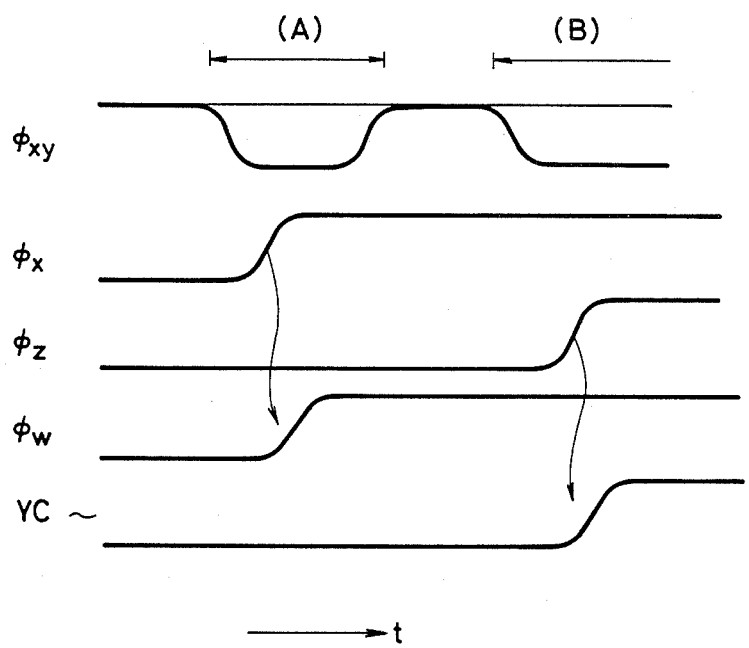

While the embodiments thus far described are based on the structure of FIG. 6, it is obvious that the X and Y decoders can be arranged in proximity as shown in FIG. 26. In the embodiment shown in FIG. 5, the Y decoder 20 is replaced with an X and Y decoder 20'. The X and Y decoder 20' carrries out the operation (A) of an X decoder and the operation (B) of a Y decoder in divided time zones. The coincidence between a pulse $\phi_{xy}$ and a pulse $\phi_x$ or $\phi_y$ is taken by a gate circuit WD or Yd so as to form the output of the word line W or the control line YC. The gate circuits WD and YD are similar in arrangement to the circuit shown in FIG. 10. Therefore, they are not described in detail.

In FIG. 26, the circuit block 10 shown in the right-hand part of the drawing does not include the function of the Y decoder. This is based on the assumption that the number of decoders required for driving the control lines YC is within the number of decoders located in the left-hand part of the drawing, and the same function as that of the left decoders is sometimes given to the right decoders 10. In the case where the juxtaposition of the gate circuits WD and YD is difficult in relation to the occupying area, the gate circuit YD can be designed in a manner to be distributed among a plurality of decoder portions.

Figure 28:
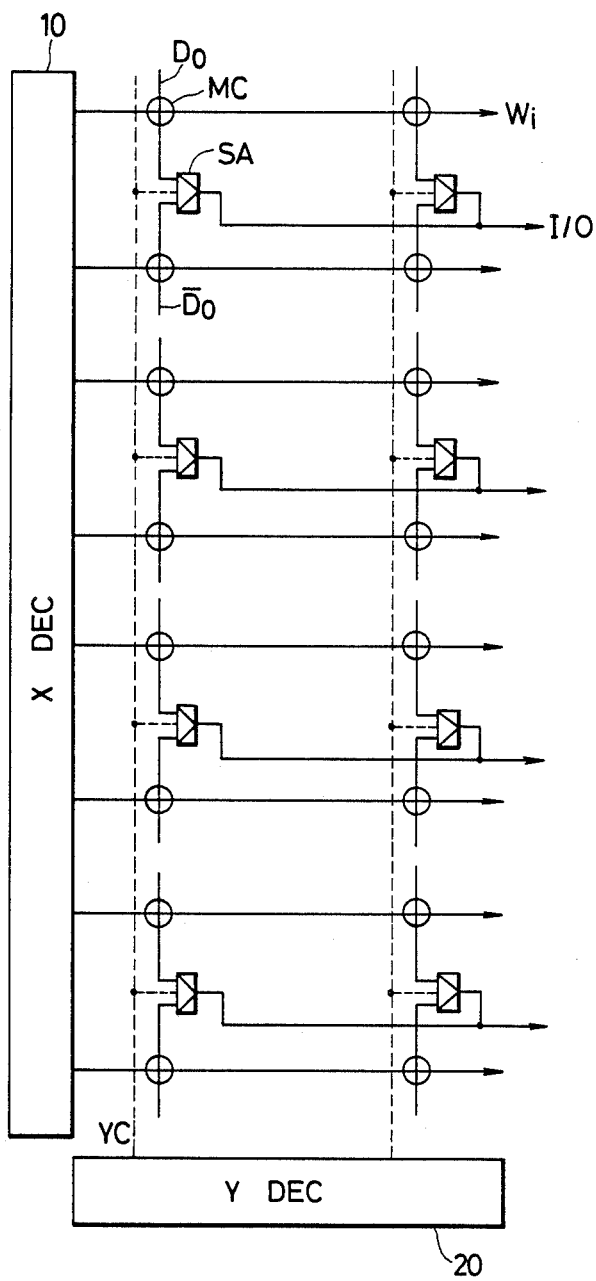

Whereas the above described embodiments are directed to the memory of the folded data line arrangement, an embodiment shown in FIG. 28 is directed to a memory of the open data line arrangement. Also in this embodiment each data line is divided into a plurality of sub lines in the lengthwise direction. This arrangement is different from the embodiment shown in FIG. 3 in that the paired data lines $D_0$ and $\overline{D_0}$ are arranged rectilinearly. In the embodiment of FIG. 6, polycrystalline silicon being a wiring material of comparatively high resistivity is used for the word lines and the word line delay time therefore poses a problem, so that in order to make the time as short as possible, the word lines are divided to arrange the circuit block 10, including the X decoder and driver, in the central position of the divided lines as illustrated in FIG. 3. In contrast, in the embodiment shown in FIG. 28, the word lines are formed of Al exhibiting a low resistivity, so that the word lines need not be divided and that the circuit block 10 is arranged at one end. Thus, one driver may be located on one side, and hence, the area of the circuit block 10 can be made small.

Figure 29:
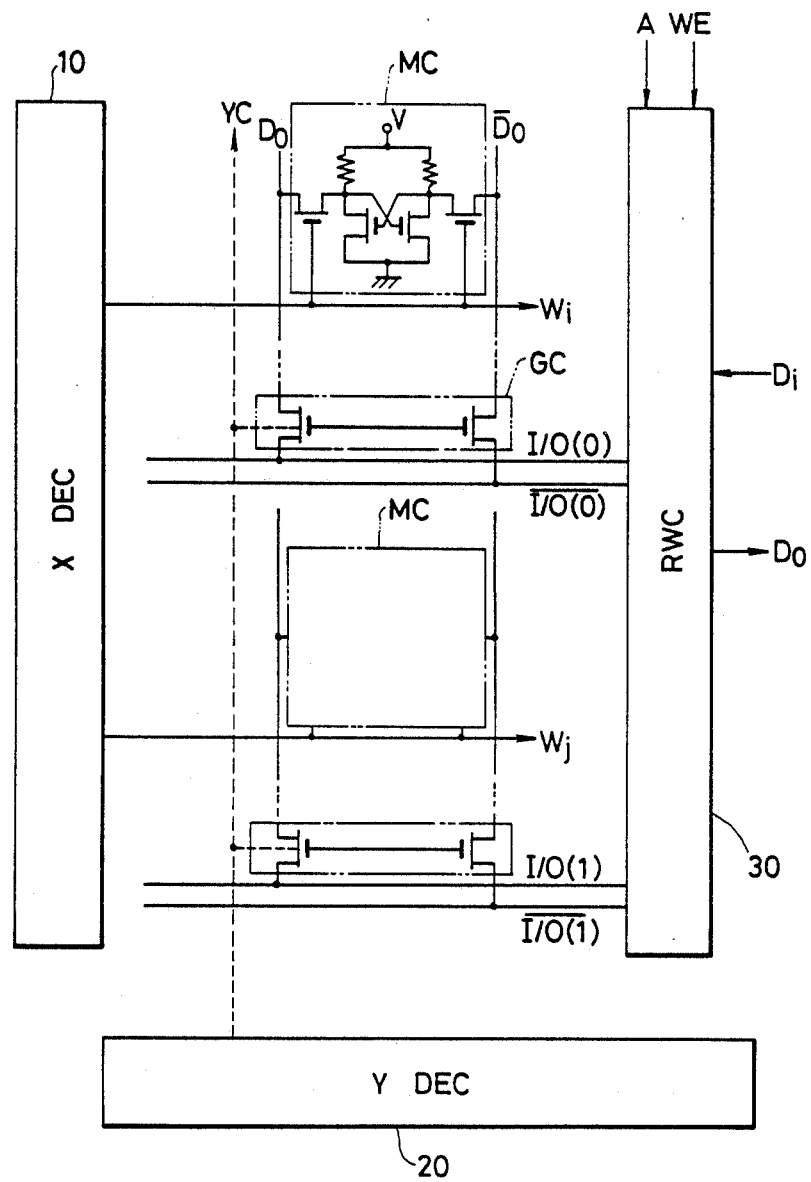

FIG. 29 shows an embodiment which is applied to a MOS static memory. When compared with the embodiments of the MOS dynamic memory shown in detail in FIG. 8, the embodiment of FIG. 29 differs in the structure of the memory cell MC and also differs in that the auxiliary circuits such as the sense amplifiers are not required for the respective pairs of data lines. The paired data lines $D_o$, $\overline{D_0}$, the common input/output lines I/O, $\overline{I/O}$, the control line YC, the switching circuit GC, etc. may be constructed similarly to those shown in FIG. 8, and are not described in detail.

Figure 30:
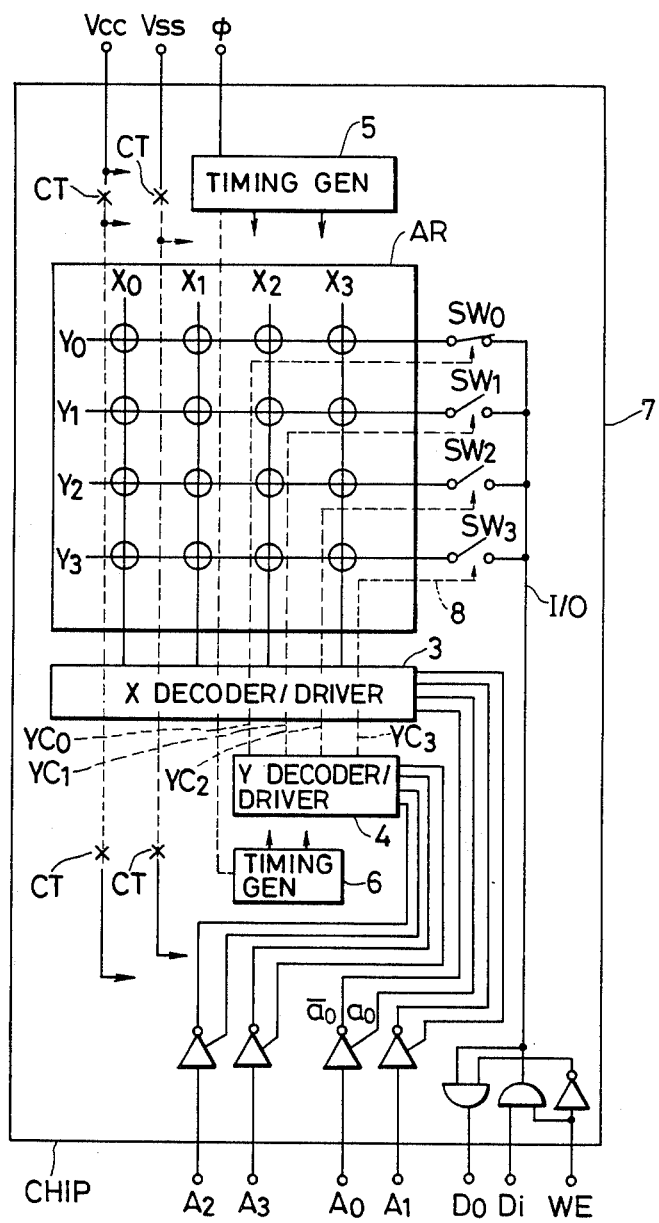
FIGS. 30–32 are diagrams each showing the arrangement of another embodiment of the present invention.

Next, FIG. 30 shows an example in which the Y decoder is disposed in parallel with the X decoder in order to further reduce the shorter side of the chip.

Different from the arrangement of FIG. 2A is that the Y decoder 4 is juxtaposed to the X decoder 3.

The power source lines and timing signal lines are laid in the direction orthogonally intersecting the data lines.

Since, in the present embodiment, the Y decoder is disposed in parallel with the X decoder, the Y control lines which control the switches for connecting the data lines and the input/output lines must be arranged on the memory array so as to avoid increase in the occupying area attributed to the prolongation of the Y control lines. To this end, the power source lines and timing signal lines are formed of the same layer as that of the Y control lines 8, and they are arranged on that part of the memory array which is other than the region for the Y control lines 8.

For example, when the memory array AR in the prior art is formed of a diffused layer, polycrystalline silicon or aluminum, two layers of aluminum may be formed so as to lay the Y control lines $YC_0$-$YC_3$ by the use of the second layer of aluminum. The power source lines and various internal timing signal lines can be passed within the memory array 2 by, for example, changing them from the wiring leads of the first layer of aluminum to those of the second layer of aluminum via through holes midway (points CT in the figure).

Thus, the dimension of one side of the chip can be shortened in correspondence with the Y decoder 4, the power source lines etc. Although the dimension of the other side increases in correspondence with the Y decoder 4 here, this is not a serious problem in practical use. The reason is that, in the dual in-line package, the dimension thereof for the longer side of the chip is comparatively surplus as apparent from the shape thereof. The pitch of the word lines $X_0$-$X_3$ and that of the Y control lines $YC_0$-$YC_3$ need not always be equalized. By way of example, when the pitch of the Y control lines $YC_0$-$YC_3$ can be rendered smaller, the power source lines and internal timing signal lines can be passed within the array in a larger number to that extent. Therefore, the number of wiring leads which are inevitably laid outside the array decreases, and in effect, the dimension of the shorter side of the chip can be rendered still smaller.

In the present embodiment, it has been explained that the Y control lines 8 and the power source lines are formed of the same conductor layer. It is also possible, however, to form the Y control lines by the use of the second layer of aluminum and the power source lines by the use of a third layer of aluminum.

Figure 31:
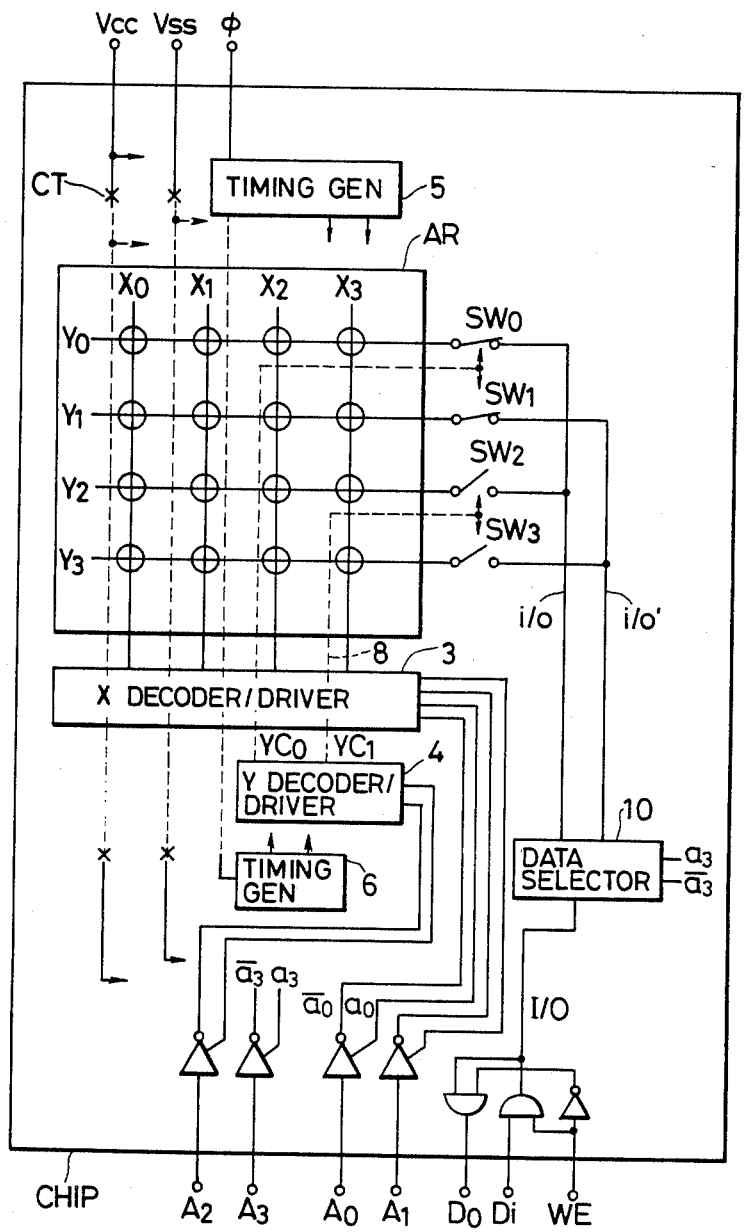

FIG. 31 shows a modified embodiment of the circuit arrangement in FIG. 30. Using a single Y control line, e.g., $YC_0$, the switches $SW_0$, $SW_1$ are simultaneously controlled to connect two input/output lines i/o, i/o' with the respectively corresponding data lines $Y_0$, $Y_1$. One of the two input/output lines i/o, i/o' is selected by a data selector circuit 10, and is connected to the input/output line I/O.

Thus, the exchange signals of the input/output lines i/o, i/o' are controlled by the data selector circuit 10. The merit of the present system is that the semiconductor memory is easy of manufacture because the pitch of the control lines 8 can be rendered large. In a case where the number of bits in the memory array is still larger, four or eight switches can also be controlled at once by the single Y control line 8.

Figure 32:
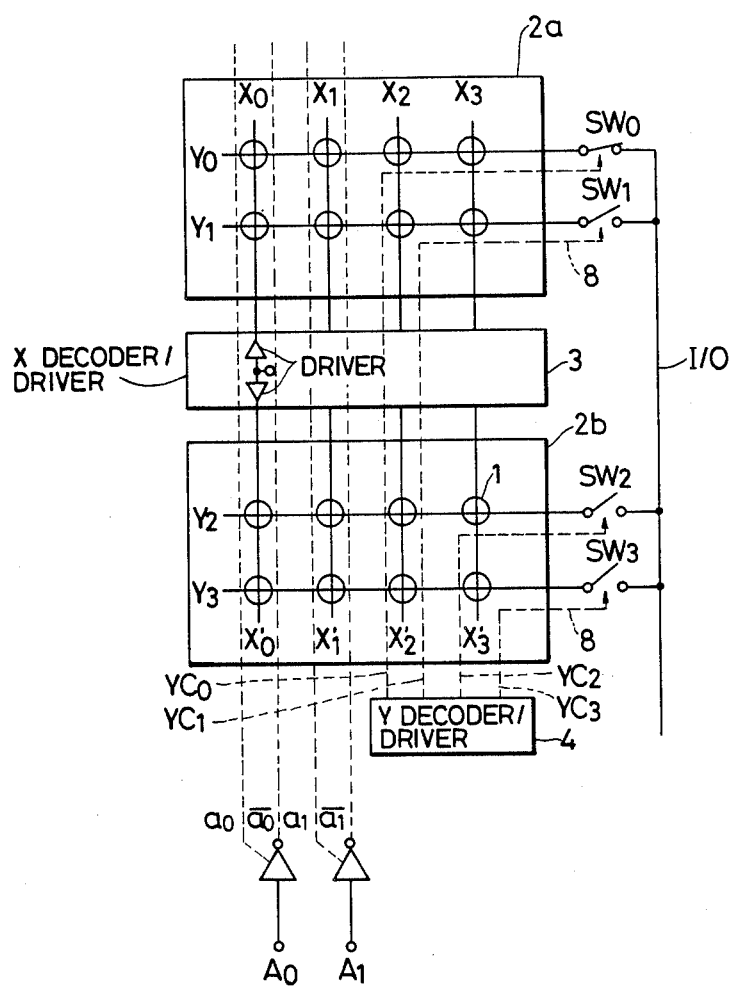

FIG. 32 shows another modification of the circuit arrangement in FIG. 30. In this modification, the same portions are assigned the same symbols.

The point of difference from the circuit arrangement in FIG. 30 is as stated below. In order to eliminate the delay of word lines attributed to the resistance components thereof in a case where the word lines are formed of a resistive material, for example, polycrystalline silicon or silicide, the memory array is divided into portions 2a and 2b, between which the X decoder 3 is disposed. Thus, the word lines are divided into sub word lines ($X_0$-$X_3$, $X_0'$-$X_3'$), and the length per word line is shortened.

This arrangement can reduce the resistance components of the word lines and shorten the delay times thereof.

Since, in the present embodiment, the X decoder is disposed between the memory arrays 2a and 2b, address signal lines $a_0$, $\overline{a_0}$, $a_1$ and $\overline{a_1}$ to be connected to the X decoder are arranged on the memory array. When, as stated before, the address signal lines are formed of a conductor layer different from that of the memory array in the prior art, they can be arranged on the memory array. As a modification of the present embodiment, an arrangement is also considered in which a plurality of sets each consisting of the memory array 2a, the X decoder 3 and the memory array 2b are repeated in the vertical direction and in which the Y decoder 4 and the address signal lines $a_0$-$\overline{a_1}$ can be used in common for the repeated sets. In this case, there is the advantage that the chip area can be reduced in correspondence with the parts omitted owing to the common use. Besides, if necessary, the Y decoder 4 can be placed between the memory arrays 2a and 2b in adjacency to the X decoder 3. Thus, the power source lines etc. can be rendered common to the X decoder 3 and the Y decoder 4 owing to the close positions thereof, so that the chip area can be reduced more.

Figure 33:
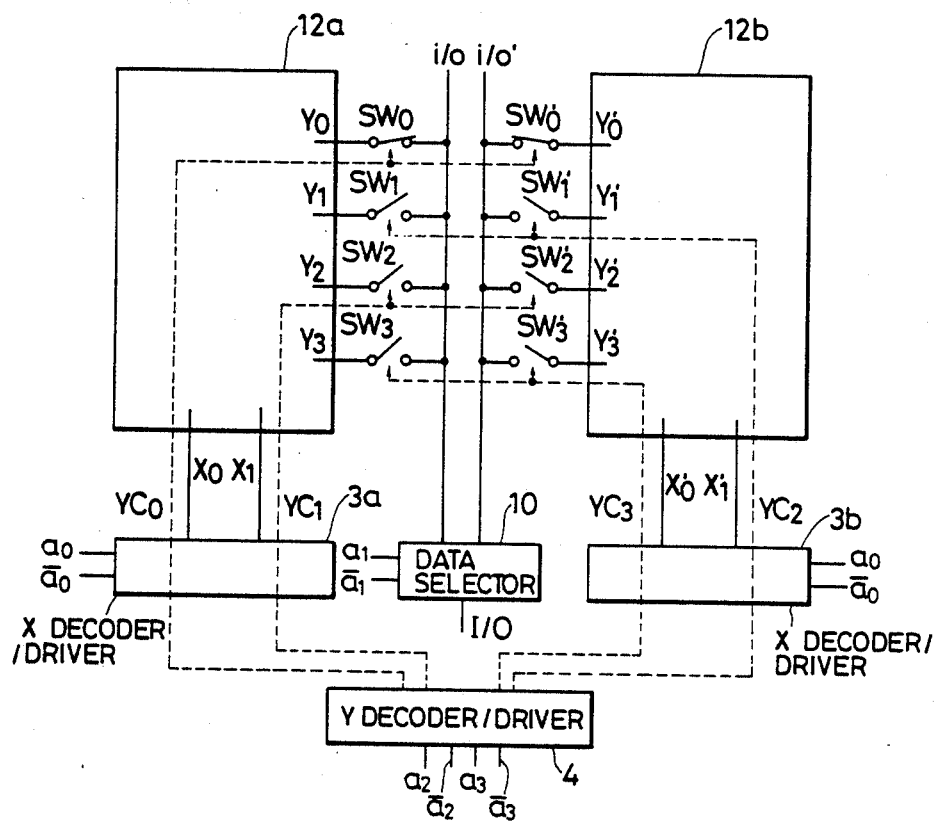
FIGS. 33–38 are diagrams each elucidating the way of connection in the case of arranging X and Y decoders in parallel.

Whereas the arrangement of FIG. 32 has divided the word lines, an arrangement in FIG. 33 shows an example in which the data lines are divided into portions $Y_0$-$Y_0'$, $Y_3$-$Y_3'$. The memory array is divided into sub arrays 12a, 12b.

In the present embodiment, the same address signal lines $a_0$, $\overline{a_0}$ are connected to X decoders 3a, 3b disposed in correspondence with the respective sub arrays, and each of the X decoders selects either of two word lines. The Y decoder 4 delivers a select signal to only one of four Y control lines. Switches $SW_0$-$SW_3$, which control the connections between the data lines ($Y_0$-$Y_3$) of the sub array 12a and the input/output line i/o respectively, and switches $SW_0'$-$SW_3'$, which control the connections between the data lines ($Y_0'$-$Y_3'$) of the sub array 12b and the input/output line i/o' respectively, are respectively operated by the signals of the common Y control lines 8.

Read signal voltages are simultaneously delivered to the input/output lines i/o and i/o', and one of them is selected by the data selector circuit 10 and is delivered to the input/output line I/O. The present embodiment has the advantage of easy manufacture because the pitch of the Y control lines 8 can be rendered great.

Figure 34:
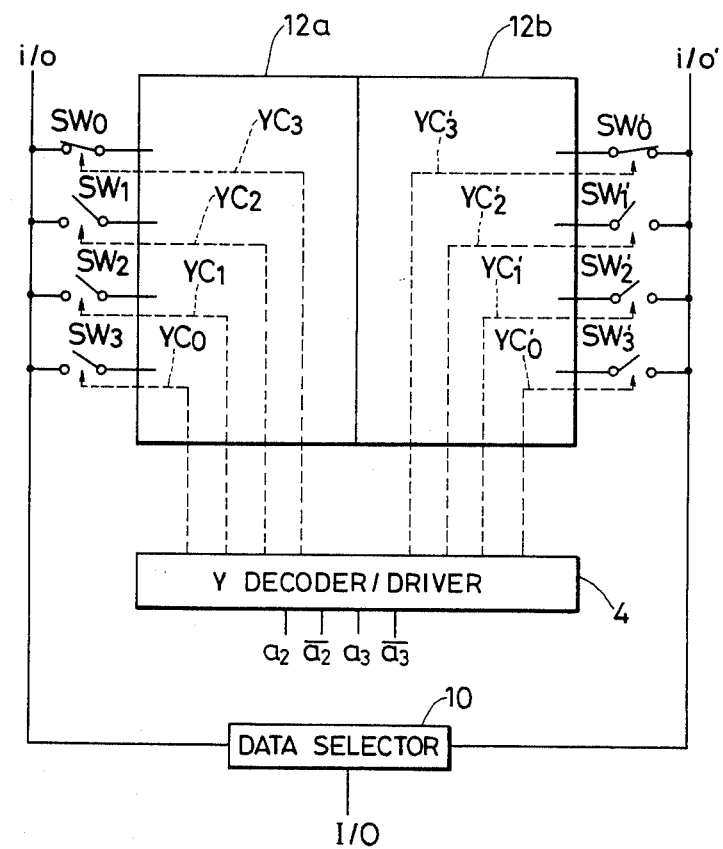

FIG. 34 shows an example in which the two sets of switches $SW_0$-$SW_3$ and $SW_0'$-$SW_3'$ are arranged apart from each other. In the present embodiment, the Y decoder 4 has two sets of Y control lines $YC_0$-$YC_3$ and $YC_0'$-$YC_3'$, which are respectively connected to the switches $SW_0$-$SW_3$ and $SW_0'$-$SW_3'$ of the sub arrays 12a and 12b. The Y decoder selects one of the respectively two corresponding Y control lines.

When it is intended to simultaneously control, for example, the switches $SW_0$ and $SW_0'$ by means of the single Y control line 8 as illustrated in FIG. 33, there arises the inconvenience that the wiring leads of the second layer of aluminum indicated by dotted lines in the figure intersect the other Y control lines. Therefore, the switches $SW_0$ and $SW_0'$ must be individually controlled by the independent Y control lines ($YC_3$, $YC_3'$) within the specified sub arrays as in the circuit arrangement shown in FIG. 34. As a modification, when the Y decoder is constructed so as to be capable of selecting only any one of the eight control lines $YC_0$–$YC_3$ and $YC_0'$–$YC_3'$, only either of the input/output lines i/o and i/o' can be supplied with a read signal. This brings forth the advantage that the other input/output line supplied with no output can be used as a signal line having another function. For example, in case of an arrangement wherein the Y control line is divided into a larger number of parts and wherein the sub arrays 12a, 12b are repeated in the lateral direction, the other input/output line as mentioned above can be diverted to the input-/output line i/o or i/o' of another sub array.

In FIGS. 33 or 34, the two read signals simultaneously delivered to the input/output lines i/o and i/o' need not be always selected into the single signal by the use of the data selector circuit 10. In some memories, it is desired to simultaneously deliver a large number of read signals out of the chip and to increase the quantity of utilizable data. In this case, the read signals may be directly delivered without passing them through the data selector circuit 10.

Figure 35:
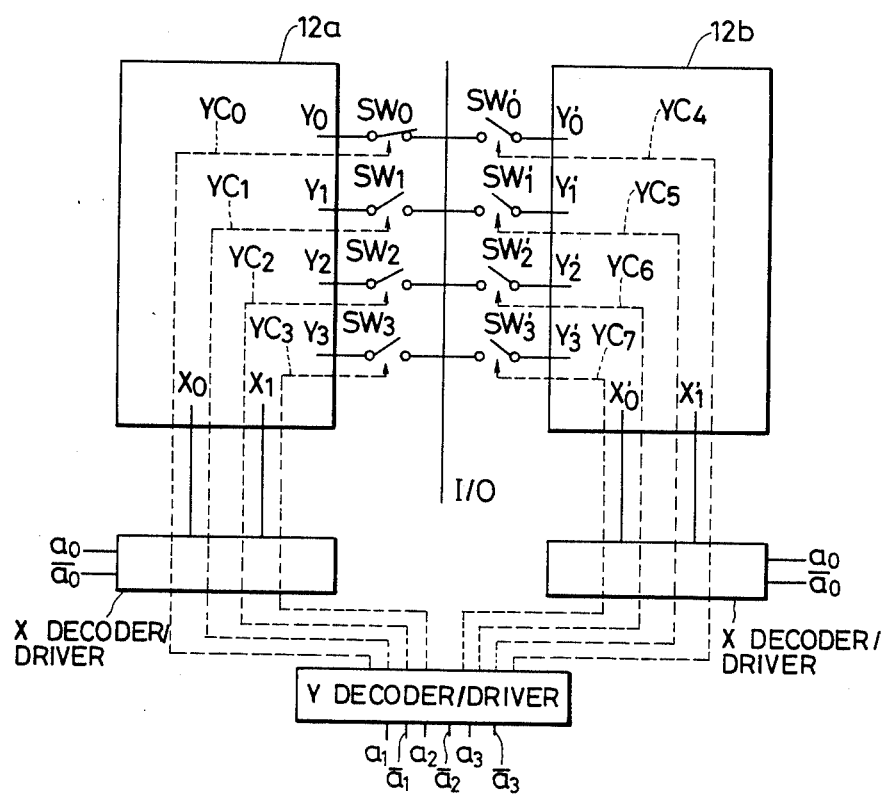

FIG. 35 shows an example in which one read signal output for the input/output line I/O is provided at all times. As compared with the arrangement of FIGS. 33 or 14, the present embodiment can reduce the chip area to the extent that the input/output lines i/o, i/o' have changed into one. The switches $SW_0$, $SW_0'$ etc. are controlled by independent Y control lines $YC_0$, $YC_4$ etc. as in FIG. 34. However, in some cases, for example, in a case where a large number of data are to be read out in parallel, two input/output lines I/O belonging to the switch $SW_0$ and to the switch $SW_0'$ can be prepared so as to derive read voltages to the two input/output lines I/O by simultaneously applying select pulses to the Y control lines, for example, $YC_0$ and $YC_4$ to simultaneously control the switches $SW_0$ and $SW_0'$.

The above examples of arrangements are applicable to all semiconductor memory cells such as the memory cells of a dynamic MOS memory, a flip-flop type static memory and a ROM. It has been conceptually exemplified that each memory cell has the single data line (Y line), it is obvious that the invention is also applicable to data pair lines concretely.

Figure 36:
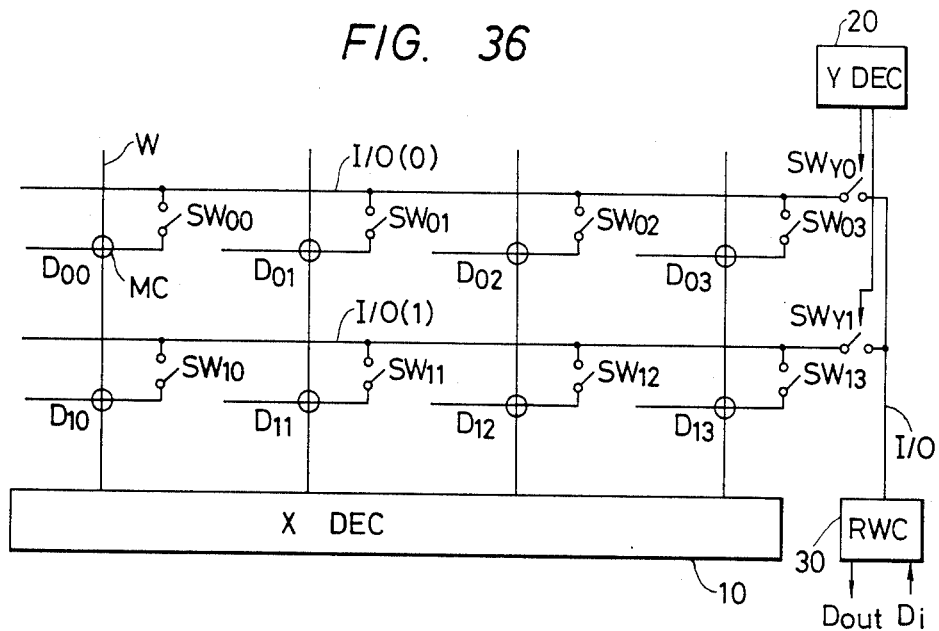

FIG. 36 shows the construction of an embodiment in which the sense of the common input/output line common to a plurality of divided data lines is different from that shown in the previous embodiments.

That is, the common input/output line I/O(0) which is common to the divided data lines $D_{00}$, $D_{01}$, $D_{02}$ and $D_{03}$ is arranged in parallel with these data lines.

The longitudinal direction of X decoder is arranged in parallel with that of Y decoder on a chip.

Figure 37:
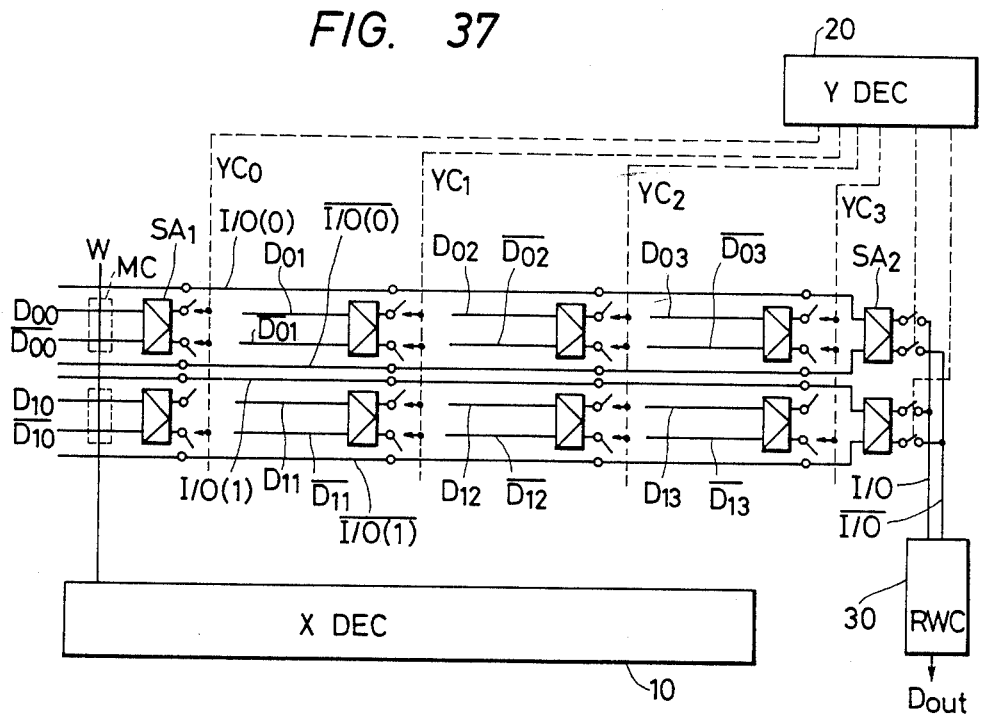

FIG. 37 illustrates an embodiment to which the structure of FIG. 36 is applied.

A sense amplifier $SA_1$ of a first stage is connected to the paired divided data lines $D_{00}$ and $\overline{D_{00}}$. Sense amplifiers of the first stage are respectively connected to the other paired divided data lines.

Paired common input/output lines I/O(0) and $\overline{I/O(O)}$ are arranged in correspondence with the data lines forming a row, and are connected to a sense amplifier $SA_2$ of a second stage. Paired common input/output lines $\overline{I/O(1)}$ and similarly arranged in correspondence with data lines of another row, and are connected to a sense amplifier of the second stage. Outputs from the sense amplifiers of the first stage arrayed in a first column are connected to the respectively corresponding common input/output lines through switches which are controlled by a control line $YC_0$ located in a direction intersecting the common input/output lines. Outputs from the sense amplifiers arrayed in the other columns are similarly connected to the corresponding common input/output lines through switches which are respectively controlled by control lines $YC_1$, $YC_2$ and $YC_3$. These control lines are selectively driven by the circuit block 20 including the Y decoder. The selection in the digit direction is performed on the output side of the sense amplifiers of the second stage by the Y decoder.

Also in this embodiment, the information of the memory cell MC is once read out onto the divided data line, and it is amplified by the sense amplifier of the first stage and then delivered to the common input/output line. Therefore, even when the charge storage capacity of the memory cell is small, the information can be read out with a sufficient margin.

Since the selective drive of the control lines $YC_0$, $YC_1$, $YC_2$ and $YC_3$ serves to effect the selection in the word direction, it may well be performed by the circuit block 10 including the X decoder.

Figure 38:
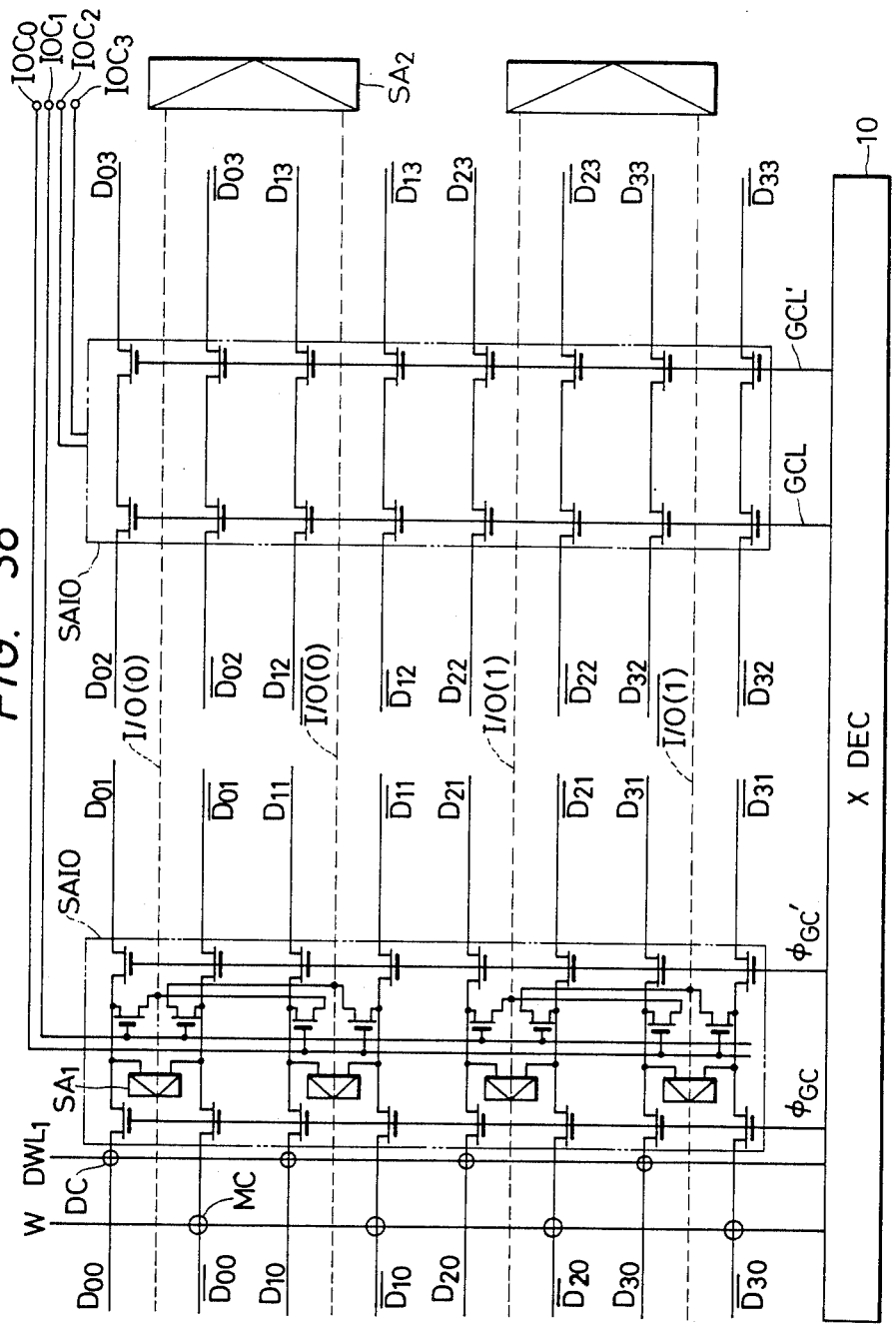

FIG. 38 shows another embodiment to which the construction of FIG. 36 is applied. The difference between the embodiment shown in this Figure from the embodiment shown in FIG. 37 is that the paired common input/output lines I/O(0) and $\overline{I/O(0)}$ are arranged in common to two pairs of data line columns. Also control lines for controlling the switching circuits pair as $IOC_0$ and $IOC_1$, or $IOC_2$ and $IOC_3$, and by driving either, one of the two pairs of data line columns is selected. Also the sense amplifier $SA_1$ of the first stage is arranged in common to the data line pair $D_{00}$, $\overline{D_{00}}$ and the data line pair $D_{01}$, $\overline{D_{01}}$, either of which is selected by the switching circuit which is controlled by control signals $\phi_{GC}$ and $\phi_{GC}'$ from the circuit block 10 including the X decoder.

Figure 39:
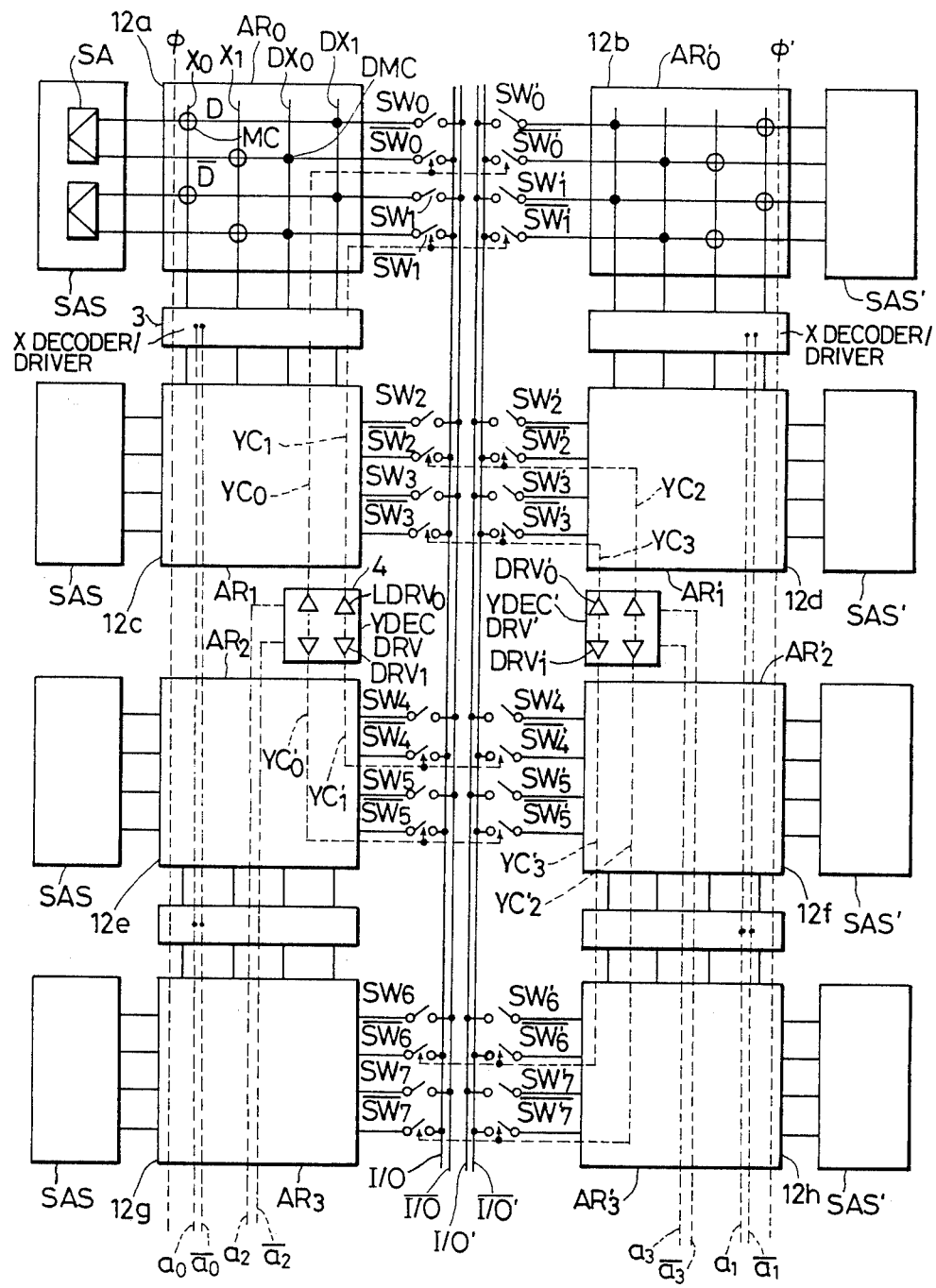
FIG. 39 and FIG. 41 are dragrams showing a semiconductor memory constructed by combining the various embodiments of the present invention.

FIG. 39 shows a practicable embodiment for FIG. 32 which employs folded data line arrangement cells. Data lines are composed of pair lines D, $\overline{D}$, and one memory cell MC (white circle in the figure) constructed of a transistor and a capacitor is connected to one of the two intersection points between the pair lines and a word line. In a case where the memory cell MC has been read out, for example, where a select pulse has been impressed on the word line $X_0$ by an X driver 3 whereby a minute signal voltage corresponding to information "1" or "0" has been derived from the memory cell to the data line D, a dummy word line $DX_0$ is simultaneously selected by the X decoder 3, and a predetermined reference voltage is delivered from the dummy cell DMC (black circle in the figure) to the data line $\overline{D}$. When the reference voltage is set at the middle point of the signal voltages of the information "1" and "0", the read signal voltage is amplified by a sense amplifier SA to discriminate "1" or "0". As to the folded data line arrangement cell, the word line is formed of a material of comparatively high resistivity such as polycrystalline silicon or silicide, so that the memory device is divided in four in the direction of the word lines after the arrangement of FIG. 32. Since, in the present embodiment, the data lines are formed by the use of wiring leads of a first layer of aluminum, control lines (YC$_0$–YC$_3$) are made of wiring leads of a second layer of aluminum. However, they may be wiring leads of the first layer of aluminum if the data lines of the folded data line arrangement cell are formed of a third layer of polycrystalline silicon by way of example. In this case, a problem in manufacture attendant especially upon the wiring leads of the second layer of aluminum is avoided, and there is the advantage of cost curtailment. Besides, the data pair lines and the Y control lines YC may well be made of the same material, for example, the first layer of aluminum. Here, when a Y decoder (including a driver) is arranged directly below a sub array 12a, the number of the Y control lines increases in the direction of the shorter side of the chip, and the Y control lines protrude from the sub array 12a in some shapes of matrices. Therefore, the Y decoder is arranged between sub arrays 12c and 12e as shown in the figure, thereby to halve the number of the Y control lines contributive to the direction of the shorter side of the chip. The present example is an example of application of FIG. 33, in which one Y control line, for example, YC$_0$ is used for controlling switches SW$_0$, $\overline{SW_0}$ simultaneously switches SW$_0'$ and $\overline{SW_0'}$ that belong to another sub array 12b. It is also possible, however, to lay independent control lines on the sub arrays 12a, 12b different from each other as in the modification of FIG. 35 and to use them for independently controlling the switches $\overline{SW_0}$, and the switches SW$_0'$ and $\overline{SW_0'}$ by way of example, thereby to derive amplified signal voltages to input/output lines I/O, $\overline{I/O}$, I/O', $\overline{I/O'}$ at the same time. Alternatively, one Y control line, for example, YC$_0$ can be used for controlling two sets of switches SW$_0$, $\overline{SW_0}$, SW$_1$, $\overline{SW_1}$ as in FIG. 31. Of course, two pairs of input/output lines I/O are required in this case. Although, in the present example of arrangement, the switches are arranged on the side opposite to the sense amplifiers, it is also possible to arrange the switches in proximity to the sense amplifiers or to arrange the sense amplifiers in proximity to the switches. In general, however, arranging the sense amplifiers outside the arrays as shown in the figure makes it easier to lay out the sense amplifiers whose layout areas are prone to increase. The reason is that, since quite no circuit is disposed on one side, the space can be effectively used. Besides, the plurality of Y control lines 8 premised to be the three-dimensional wiring of the uppermost layer may be wired in a shape enveloping the groups of switches to be controlled, as illustrated in the figure, in order to prevent them from crossing on the arrays. Further, the Y control lines may be wired as illustrated in the figure in order to mitigate the complicacy of design relevant to wiring lead delays in such a way that the lengths of the Y control lines to pass on the sub array 12a and the lengths of the Y control lines to pass on the sub array 12b are equalized to the utmost. That is, the switches of the sub arrays 12a, 12b and those of the sub arrays 12e, 12f may be controlled by the Y control lines extended from the Y decoder on the left side, while the switches of the sub arrays 12c, 12d and those of the sub arrays 12g, 12h by the Y control lines extended from the Y decoder on the right side. In this regard, in case of controlling the switches SW$_1$, $\overline{SW_1}$ and SW$_1'$, $\overline{SW_1'}$ belonging to the sub arrays 12a and 12b by way of example, only one DRV$_0$ of two drivers for driving the two divided Y control lines respectively may be turned on to impress a pulse on the Y control line YC$_1$. In this case, the other driver DRV$_1$ must be turned off so as not to apply a pulse to the Y control line YC$_1'$. The reason is that two sorts of read signal voltages are simultaneously delivered (multiple selection) from the sub arrays 12a and 12b to the input/output lines I/O, $\overline{I/O}$, resulting in a malfunction. In the present embodiment, the lines of the address signals a$_0$, $\overline{a_0}$ determining the X decoder, the address signals a$_2$, $\overline{a_2}$ determining the Y decoder, etc. pass on the sub arrays as stated before. It is also possible to reduce the chip area in effect, in such a way that the lines of the other control signals $\phi$, $\phi'$ or the power source lines, which are not mentioned in the present example but have been stated before, are passed on the arrays throughout. The use of the folded bit line arrangement cells brings forth the advantage that, even when coupled voltages are induced in the same phase on the data pair lines D, $\overline{D}$ through coupling capacitances by the control signals $\phi$, $\phi'$, these voltages can be cancelled and rendered null in point of differential noise. It is sometimes necessary, however, to suppress even the inphase coupled voltages to small magnitudes. In this case, to the end of reducing the number of control signals which couple to the same data pair lines D, $\overline{D}$, it is also effective to lay the lines of these control signals equally on the side of the sub array 12a and the side of the sub array 12b. Further, as a modification of the present embodiment, there can also be an arrangement in which the switches are controlled by the Y control lines belonging to the sides of the sub arrays 12a, 12b, as by using the Y control line YC$_0$ to control the switches $\overline{SW_0}$, SW$_0$, $\overline{SW_0'}$, SW$_0'$, the Y control line YC$_2$ to control the switches SW$_1$, $\overline{SW_1}$, SW$_1'$, $\overline{SW_1'}$, the Y control line YC$_1$ to control the switches SW$_2$, $\overline{SW_2}$, SW$_2'$, $\overline{SW_2'}$, and the Y control line YC$_3$ to control the switches SW$_3$, $\overline{SW_3}$, SW$_3'$, $\overline{SW_3'}$, and also using the Y control lines YC$_0'$–YC$_3'$ to perform similar controls.

Next, a method of wiring the Y control lines YC in the embodiment of FIG. 39 will be described in connection with folded bit line arrangement cells.

Figure 40A:
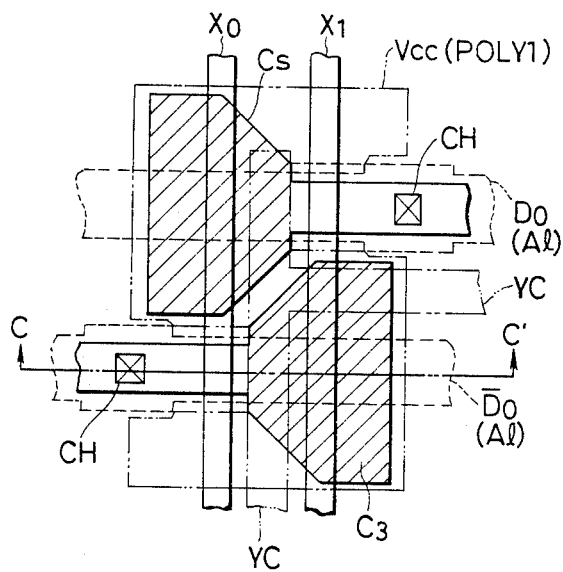
FIG. 40A is a layout plan of a folded bit line arrangement cell for use in the semiconductor memory of FIG. 39, FIG. 40B and FIG. 42–47 are circuit diagrams of the folded bit line arrangement cell.
Figure 40B:
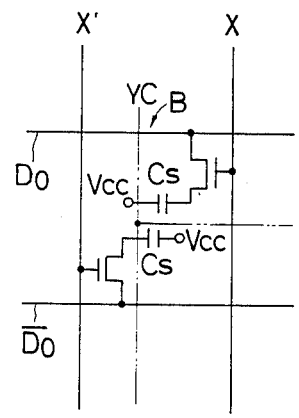
FIG. 40C is a sectional view of the folded bit line arrangement cell.
Figure 40C:
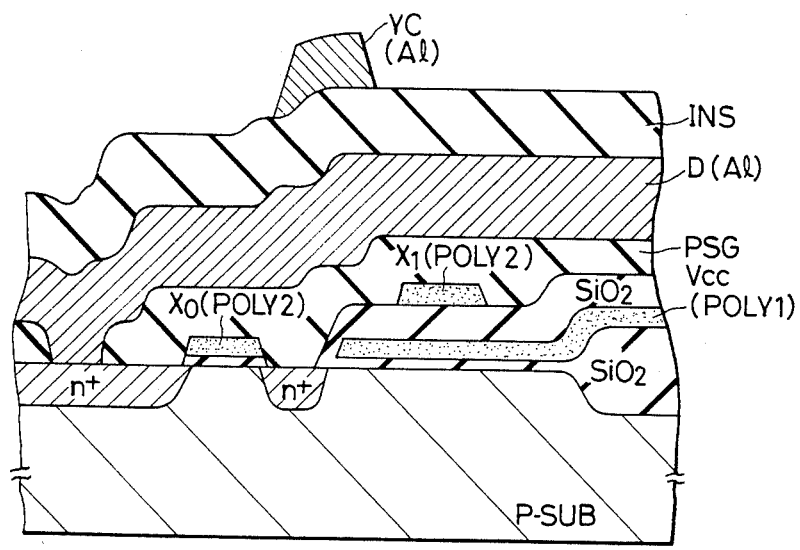

FIG. 40A is a layout plan of the folded bit line arrangement cell, FIG. 40B is a circuit diagram thereof, and FIG. 40C is a sectional view taken along line C—C' in FIG. 40A.

A storage capacitance C$_S$ in the memory cell is formed between a first layer of polycrystalline silicon (POLY1 in the drawing) and a p-type substrate pSUB with a thin oxide film SiO$_2$ therebetween, and it is formed in a hatched part in FIG. 40A. A data line D$_0$ is formed of aluminum which is connected with a diffused layer n+ by a contact hole (CH in the drawing). Symbol INS in FIG. 40C denotes an inter-layer insulator film which is located between a data line D$_0$ and a Y control line YC. Word lines X are formed of a second layer of polycrystalline silicon (POLY2). Here, the word lines may well be made of silicide of lower resistivity or a material suited to self-alignment, such as molybdenum or tungsten. The data lines may well be formed of another layer different from the first layer of polycrystalline silicon (POLY1) or the second layer of polycrystalline silicon (POLY2). In this case, aluminum for the first layer of wiring can be used for the Y control lines YC as stated before. In a case where, as to such folded bit line arrangement cells, the Y control line YC wired on the array in parallel with the word line X is bent by 90° midway to be laid in parallel with the data line D$_0$, the embodiment in the drawing serves to reduce noise coupled to the data pair lines by the Y control line YC or noise coupled to the Y control line by the word line X. More specifically, the Y control line YC is arranged between the word lines $X_0$ and $X_1$ so as to reduce the coupled capacitances thereof. This prevents the situation in which, when a pulse has been impressed on the selected word line, a voltage couples to the Y control line due to the capacitive coupling between the word line and the Y control line, so that the switch to be controlled by the Y control line turns on. Or, it prevents the situation in which, when a pulse has been impressed on the selected Y control line, a voltage couples to the non-selected word line to turn on the memory cells connected to this word line. In addition, in order to equally couple the Y control line with the data pair lines $D_0$, $\overline{D_0}$ so as to lessen differential noise to the data pair lines, the Y control line is intentionally coupled to the data line $D_0$ (point B in the drawing). For the same purpose, the Y control line is laid in the middle part between the data lines $D_0$ and $\overline{D_0}$.

A wide wiring lead such as the power source line is laid on a plurality of word lines.

Figure 41:
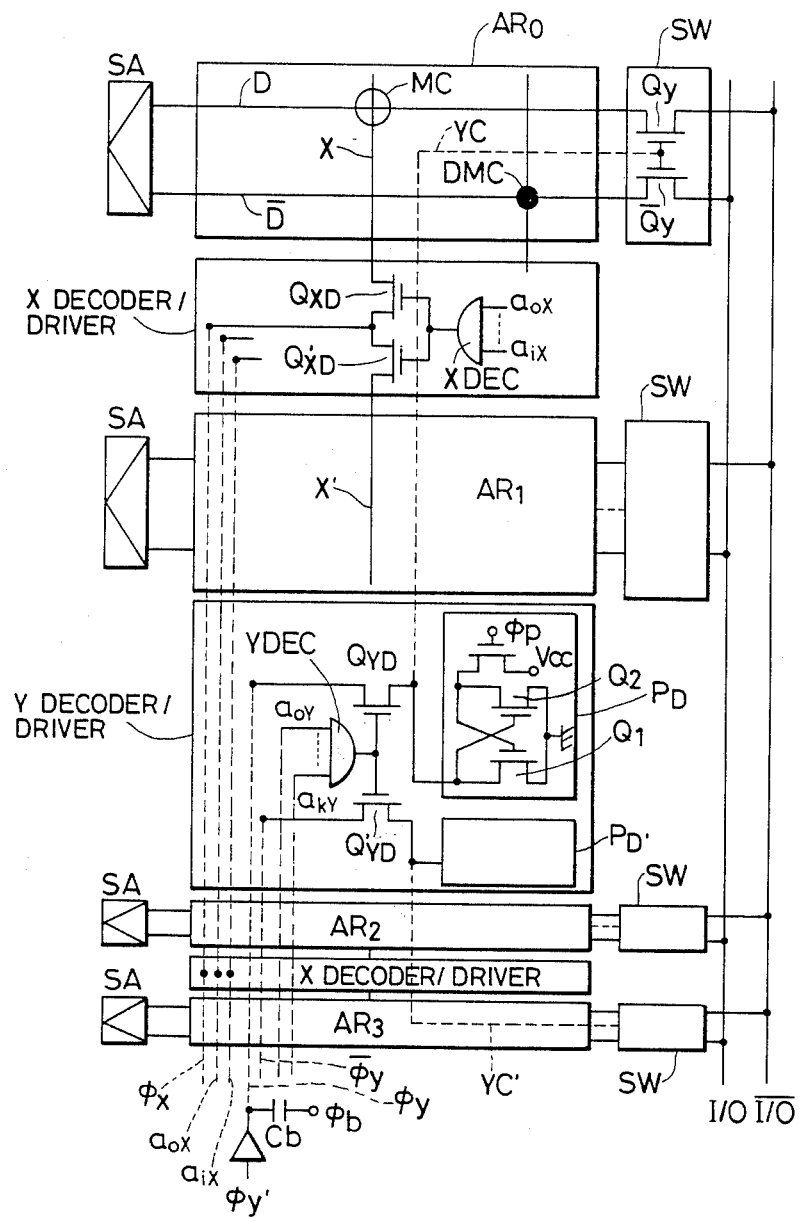

FIG. 41 shows a part of the circuit arrangement of FIG. 39 in detail. In the drawing, only one pair of data lines is shown in each sub array.

Known circuits such as a precharge circuit and an active restore circuit are usually connected to the data pair lines, but they are omitted from the present example because they are not directly pertinent to the essence of the invention. The sense amplifier SA in the figure is constructed of an ordinary flip-flop. In the present example, minute signal voltages read out from the memory cell MC and the dummy cell DMC to the data pair lines are amplified by the sense amplifier SA, and they are delivered as differential outputs to the input/output lines I/O, $\overline{I/O}$ when transistors $Q_y$, $\overline{Q_y}$ are turned on by a pulse voltage applied to the selected Y control line YC. In a writing operation, as stated before, differential inputs corresponding to write data information are applied to the input/output lines I/O, $\overline{I/O}$ and are transmitted to the data pair lines through the selected switch SW, and the write data information is written into the selected memory cell. Here, the word line is selected as stated below. First, a select signal is provided from an X decoder (X DEC) in accordance with address signals $a_{0x}, \ldots, a_{ix}$ which run on arrays related with the selection of the word lines, whereupon word pulses are impressed on a plurality of sub word lines (X, X') through drivers $Q_{XD}$, $Q'_{XD}$ in accordance with a word line start signal $\phi_X$. In addition, address signals $a_{0Y}, \ldots, a_{kY}$ related with the selection of the Y control lines pass on the arrays, and a select signal is provided from a Y decoder (Y DEC) in accordance with them. Next, a Y control line start pulse is impressed, and only the specified Y control line is supplied with the pulse and controls the switch SW. Here, in order to reduce impedances at the turn-on of the transistors $Q_y$, $\overline{Q_y}$ in the switch SW, thereby to perform the exchanges of data between the data pair lines D, $\overline{D}$ and the input/output lines I/O, $\overline{I}/$ at high speed, the pulse voltage which is applied to the Y control line is controlled so as to become an amplitude sufficiently higher than a supply voltage. More specifically, assuming the supply voltage to be 5 V, when a pulse of 5 V is impressed on a line $\phi'_y$, a pulse of 5 V is also delivered to the Y control line. On that occasion, a boosting clock signal $\phi_b$ having an amplitude of 5 V is applied from one end of a capacitor $C_b$. Thus, the Y control line is eventually fed with a pulse $\phi_y$ which is such that a voltage with the pulse amplitude of the signal $\phi_b$ divided by the capacitance of the capacitor $C_b$ and the parasitic capacitance of the Y control line is added to the pulse $\phi'_y$. Such boosting technique has been applied to word lines in a conventional dynamic memory for the purpose of increasing charges to be stored in memory cells, and the similar technique is also usable for the Y control lines. In the figure, symbols PD and PD' denote pull-down circuits for bringing non-selected Y control lines into low impedance.

The pull-down circuit is disposed in order to prevent the Y control line from developing noise due to the capacitive coupling with the word line, resulting in the malfunction of the switch SW.

Before the reading or writing operation of the memory cell, a high voltage is applied to the gate of a MOS transistor $Q_1$ by a precharge signal $\phi_p$ so as to turn on the MOS transistor $Q_1$. Thus, all the Y control lines become low impedances which are governed by the impedances of the MOS transistors $Q_1$, and the coupling noise is rendered difficult to be induced as described before. Meanwhile, in a case where a MOS transistor $Q_{YD}$ has been turned on by the Y decoder and where the pulse $\phi_y$ has flowed to the Y control line, the MOS transistors $Q_{YD}$ and $Q_1$ perform a ratio operation, with the result that a high voltage thereby determined is generated on the Y control line. By this voltage, a MOS transistor $Q_2$ is turned on, and the gate voltage of the MOS transistor $Q_1$ becomes 0 V to turn off this MOS transistor $Q_1$. Since the ratio operation continues for a short time, the power consumption does not increase. In a case where the layout area for the pull-down circuits PD, PD' etc. enlarges to pose a problem, a single control system may be formed without preparing the two perfectly independent control systems which include the pulse lines $\phi_y$, $\overline{\phi_y}$, drivers $Q_{YD}$, $Q'_{YD}$ and Y control lines YC, YC'. Thus, the Y control lines YC and YC' can be unified into a single control line, so that one pull-down circuit suffices. In this case, however, if the switches SW to be selected belong to the sub arrays $AR_0$ and $AR_3$, separate input/output lines I/O, $\overline{I/O}$ need to be respectively disposed for the sub arrays $AR_0$ and $AR_3$.

While, in the above embodiment, a flip-flop circuit has been employed as the pull-down circuit, it can be replaced with a single transistor whose gate is supplied with a fixed voltage when the occupying area of layout poses a problem.

Figure 42:
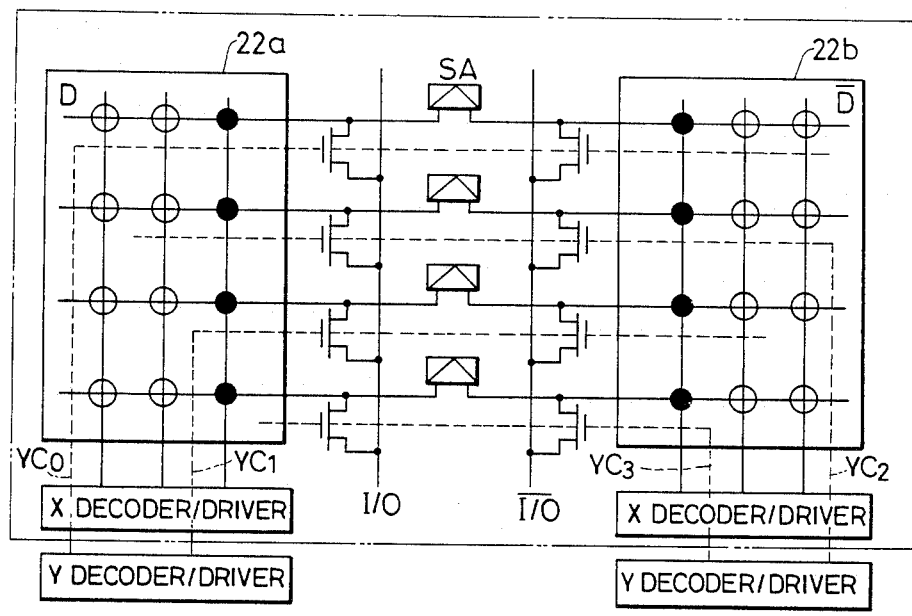

FIG. 42 shows an example in which the present system is applied to the dynamic memory cell of an open data line arrangement cell. White circles in arrays indicate memory cells, and black circles dummy cells. The structure is detailed in the paper mentioned before. The present example is an example in which switches confront the inner sides of the arrays 22a, 22b. It differs from the arrangement of FIG. 33 in the following point. In the case of FIG. 33, the memory cells belonging to the sub arrays 12a, 12b are independently selected, and the two independent data are applied to or from the input/output lines i/o, i/o', whereas in the embodiment of FIG. 42, one data is applied to or from the input/output line I/O or $\overline{I/O}$ and it is differentially applied. In the present example, in order to hold the electrical balance between data pair lines D, $\overline{D}$, a Y control line is laid in parallel with the respective data lines D, $\overline{D}$ so as to have equal coupled capacitances with both the data lines D, $\overline{D}$. The Y control lines are extended alternately from right and left Y decoders. However, when the Y control line is lengthened in order to equalize the coupled capacitances, it intersects another Y control line. Therefore, it is in no way possible to equalize the length over which the Y control line and the data line D couple and the length over which the Y control line and the data line $\overline{D}$ couple. Accordingly, the electrical unbalance between the data lines D and $\overline{D}$ is liable to occur, resulting in great noise.

Figure 43:
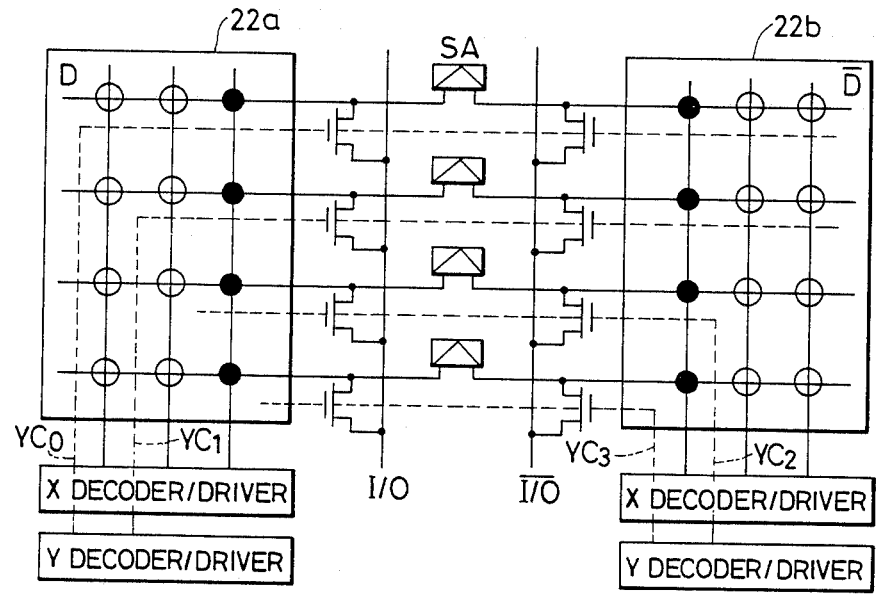

An embodiment in FIG. 43 is basically the same as the circuit arrangement of FIG. 42, and it differs only in that the Y control lines of the left Y decoder and those of the right Y decoder are arranged in the order of the data lines as reckoned from the uppermost one. Also in this case, likewise to the above, the data lines D, $\overline{D}$ become electrically unbalanced.

Figure 44:
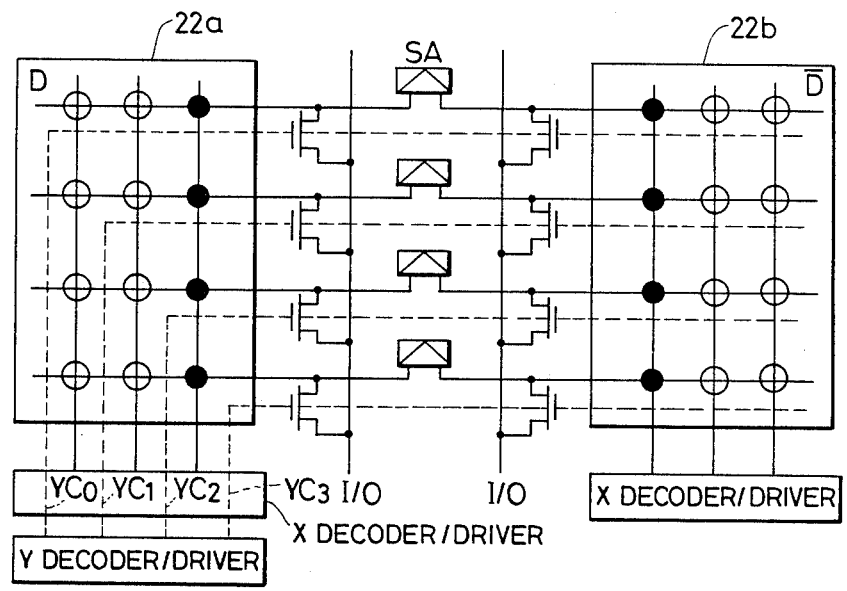

Also an embodiment in FIG. 44 is basically the same as the circuit arrangement of FIG. 42, and it differs only in that all the switches are selected by the Y decoder disposed on the left side. Also in this case, the data lines D, $\overline{D}$ similarly become electrically unbalanced.

Figure 45:
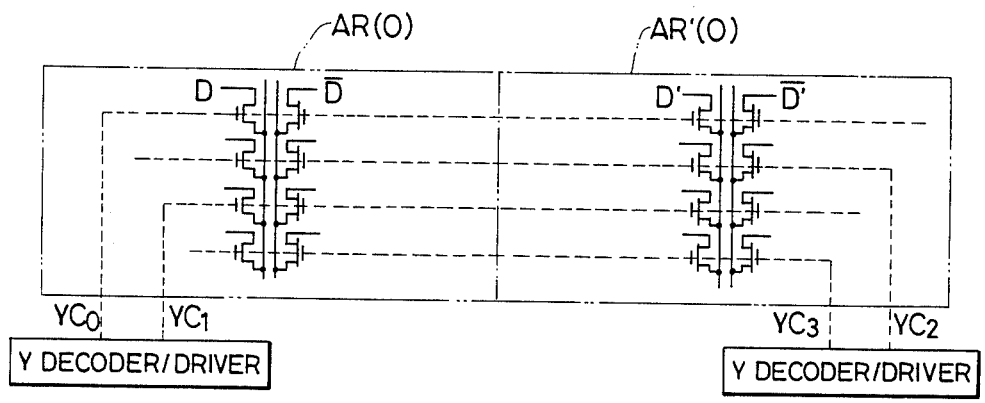

With the circuit arrangements of FIGS. 42–44, in a case where various timing pulse signal lines for controlling the memory operation (for example, the signal line of the signal $\phi$ in FIG. 2A) are passed through the array, they couple with the data lines of the data pair lines on one side, and hence, differential noise is liable to develop. Accordingly, the number of the signal lines which can pass on the array is limited, so that shortening the shorter side of the chip is more limited than in the case of the folded data line arrangement cells. However, when compared with the folded data line arrangement cells, the open data line arrangement cells permit the word lines to be formed of aluminum of low resistivity and therefore need not divide the memory in the direction of the word lines. Accordingly, they have the advantage that the longer side of the chip can be rendered smaller than in the case of the folded data line arrangement cells. The open data line arrangement cells are, in general, inferior in the signal-to-noise ratio, and in order to improve this drawback, the system of dividing the data lines as in FIG. 33 is common. In this case, there is a method in which the arrangement of FIG. 42 is simply multiplexed. That is, when the entirety of FIG. 42 is deemed a sub array AR(0), the arrangement of the sub array AR(0) is repeated in the direction of the data lines. In other words, the Y control lines are completed within the sub arrays AR, $\overline{AR}$ to which one set of sense amplifiers belong. Another method is such that, as shown in FIG. 45, Y control lines are laid and controlled in common between larger sub arrays AR(0), AR'(0). It is obvious that the data lines can be divided similarly on the basis of the concepts in FIGS. 43 and 44.

Figure 46:
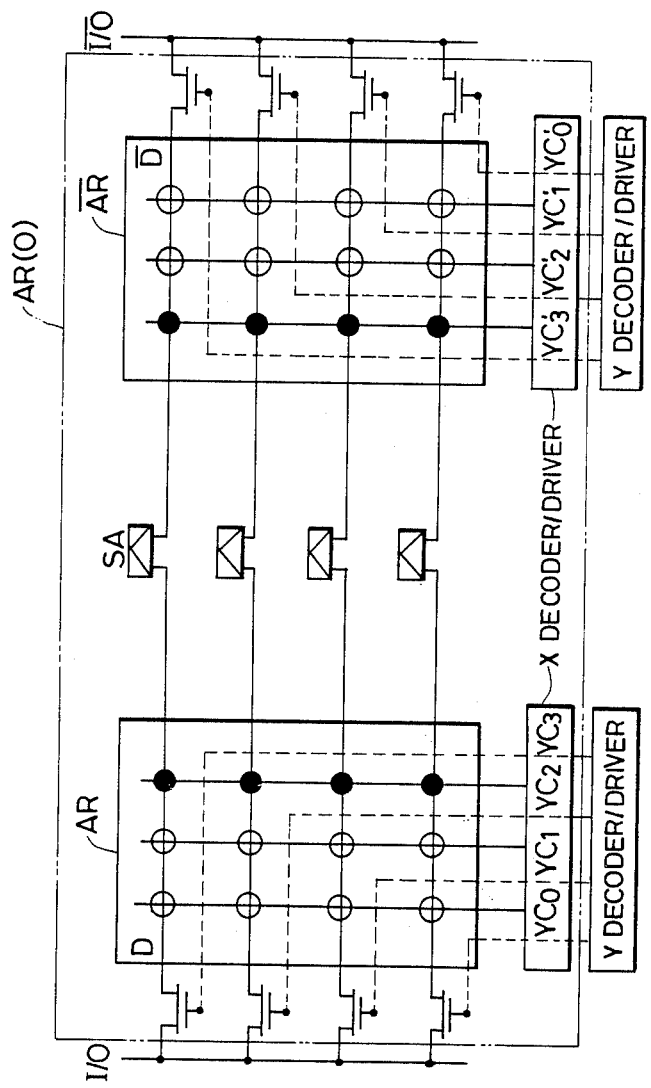

FIG. 46 shows an embodiment in the case where, as regards the open data line arrangement cells, switches SW are arranged at ends remote from sense amplifiers SA. In general, the layout area of the sense amplifiers SA becomes large, so that when the switches are laid out in proximity thereto, the electrical balance between the data pair lines becomes difficult to hold. Therefore, the present embodiment which separates the switches away from the sense amplifiers SA is important in practical use. Formally, the present embodiment is also considered a practical example of the arrangement of FIG. 34. However, in the arrangement of FIG. 34, the two data signals independent of each other are applied to or from the input/output lines i/o, i/o', whereas in the embodiment of FIG. 46, one data signal is differentially applied to or from the input/output I/O or $\overline{I/O}$. The advantage of the present embodiment is that the electrical balance of the respective data pair lines is substantially perfect. The reason is that the data lines D, $\overline{D}$ and Y control lines $YC_3$, $YC_3'$ are capacitively coupled substantially equally. In operation, two corresponding Y control lines such as the Y control lines $YC_3$ and $YC_3'$, those $YC_2$ and $YC_2'$, those $YC_1$ and $YC_1'$ or those $YC_0$ and $YC_0'$ are always selected by Y decoders, and the data of the memory cell selected by an X decoder is exchanged between the corresponding data pair line and the input/output line I/O or $\overline{I/O}$.

Figure 47:
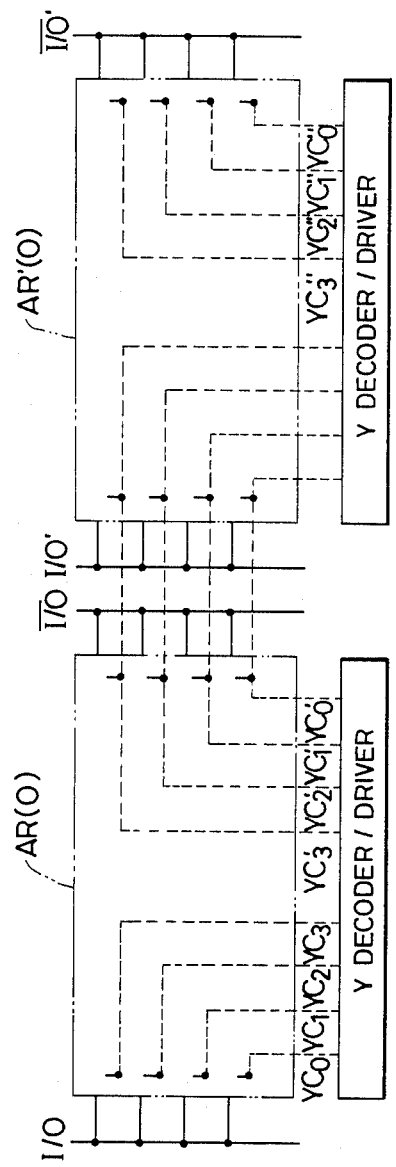

FIG. 47 shows an expanded example of the arrangement of FIG. 46 corresponding to FIG. 45 in which the data lines are divided. Switches on the sides of input/output lines I/O, I/O', which belong to sub arrays AR(0) and AR'(0), are controlled by the same Y control lines. Y control lines $YC_3$, $YC_3'$, $YC_3''$ are simultaneously selected, and data are exchanged with two pairs of input/output lines I/O, $\overline{I/O'}$, The concrete wiring of the Y control lines for the open data line arrangement cells may be considered similarly to the case of FIG. 40A.

While, in the above, the practicable embodiments have been described by taking the dynamic memory as an example, the relationship of the mutual positions of an X decoder and a Y decoder and the control method employing Y control lines YC to be controlled by the Y decoder, as well as the wiring method thereof, are common to all semiconductor memories. Accordingly, the present invention is applicable to the other semiconductor memories as it is, with the result that reduction in the chip size is permitted. In addition, while the effect of shortening the dimension of the shorter side of a chip has been chiefly described in the above concrete examples, it is obvious that the invention is similarly applicable when the dimension of the longer side of the chip is to be shortened. This is apparent from the subject matter of the present invention that decoders and drivers may be prevented from being arranged in the direction in which the chip dimension is to be shortened.

Since, as the result of the above, the semiconductor memory according to the present invention can be rendered slender, an elongate package especially made of plastics can be used. As a result, the invention can reduce the packaging cost.

As described above, according to the present invention, one side of a chip can be shortened, and this is convenient for application to an elongate package.

The present invention does not only apply for a memory device having data lines for both inputing and outputing memory signals, but also applies for a memory device having two types of data lines, such that one type is for inputing a memory signal and the other type is for outputing a memory signal.

What is claimed is:

1. A semiconductor circuit comprising:
    a plurality of data lines;
    a plurality of word lines which are arranged so as to intersect said plurality of data lines;
    a plurality of memory cells which are disposed at intersection points between said plurality of data lines and said plurality of word lines;
    a row decoder which selects at least one from among said plurality of word lines;

a column decoder which generates a signal for connecting one of said plurality of data lines to a common line; and a plurality of wiring leads formed of a conductive layer which are arranged so as to intersect said plurality of data lines, wherein said wiring leads operate as power source line or signal lines of signals for controlling operation timings of said semiconductor circuit, wherein said plurality of data lines are divided into a plurality of sub data lines in a lengthwise direction thereof, said semiconductor circuit further comprising:

a plurality of said common lines each of which is disposed in common for at least two of said sub data lines and is connected to these sub data lines through a third switch; and control lines which transmit select signals generated by said column decoder, to the third switches in order to drive said third switches and are disposed in parallel with said sub data lines.

2. A semiconductor circuit according to claim 1, further comprising a plurality of sense amplifiers each of which differentially amplifies signals of two of said data lines which are arranged in parallel so as to be capacitively coupled with said wiring leads equally.

3. A semiconductor circuit according to claim 2, wherein asid memory cell is arranged at only one of two intersection points between said word line and said two data lines which have signals to be differentially amplified.

4. A semiconductor circuit according to claim 3, further comprising a circuit which precharges said two data lines to a voltage of a substantially intermediate level of two sorts of voltages to be written into said memory cell, said precharging being done before said word line is driven.

5. A semiconductor circuit according to claim 4, further comprising an active restore circuit which is disposed between two data line pairs to be differentially amplified and which is connected with said two data line pairs through first and second switches operating selectively, to charge the data line on a high potential side of that of said two data line pairs amplified by said sense amplifier.

6. A semiconductor circuit according to claim 2, wherein said sense amplifier has two data line pairs to be differentially amplified, on both its sides, and further wherein said sense amplifier is connected with said two data line pairs through first and second switches operating selectively.

7. A semiconductor circuit according to claim 5, further comprising common lines which are disposed between said two data line pairs and which are selectively connected to said two data line pairs by said first and second switches.

8. A semiconductor circuit according to claim 1, wherein said sub data lines and said control lines are formed of a first layer of aluminum, said wiring leads are formed of a second layer of aluminum, and said word lines are formed of a material which can be used in a self-alignment process.

9. A semiconductor circuit according to claim 1, wherein said control lines and said wiring leads are formed of a first layer of aluminum, said sub data lines are formed of a second layer of aluminum, and said word lines are formed of a material which can be used in a self-alignment process, and further wherein those of said third switches which are connected to a plurality of sub data lines most remote from said column decoder are disposed on the column decoder sides of said sub data lines, and said wiring leads are arranged so as to intersect the most remote sub data lines.

10. A semiconductor circuit according to claim 1, wherein said plurality of word lines are divided into sub word lines in a lengthwise direction thereof, and said row decoder has the divided sub word lines on upper and lower sides thereof and includes means to selectively drive the sub word lines on one of the upper and lower sides.

11. A semiconductor circuit comprising:
a plurality of data lines;
a plurality of word lines which are arranged so as to intersect said plurality of data lines;
a plurality of memory cells which are disposed at intersection points between said plurality of data lines and said plurality of word lines;
a row decoder which selects at least one from among said plurality of word lines;
a column decoder which generates a signal for connecting one of said plurality of data lines to a common line; and
a plurality of wiring leads formed of a conductive layer which are arranged so as to intersect said plurality of data lines, wherein said wiring leads operate as a power source line or signal lines of signals for controlling operation timings of said semiconductor circuit,
wherein said plurality of data lines are divided into sub data lines in a lengthwise direction thereof, and said column decoder has said sub data lines on right and left sides thereof, said semiconductor circuit further comprising:
a plurality of said common lines which are disposed in common for at least two of said sub data lines and which are connnected to these sub data lines through third switches; and
control lines which transmit select signals generated by said column decoder to said third switches in order to drive them, which are respectively disposed in parallel with said sub data lines on the right and left sides of said column decoder and which are formed of the same conductor layer as that of said wiring leads,
wherein those of said third switches which are connected to two sets of subdata lines most remote from the right and left sides of said column decoder respectively are disposed on the column decoder side of said sub data lines, and further wherein said wiring leads are arranged so as to intersect said two sets of sub data lines most remote from the right and left sides of said column decoder, respectively.

12. A semiconductor circuit comprising:
a plurality of data lines;
a plurality of word lines which are arranged so as to intersect said plurality of data lines;
a plurality of memory cells which are disposed at intersection points between said plurality of data lines and said plurality of word lines;
a row decoder which selects at least one from among said plurality of word lines;
a column decoder which generates a signal for connecting one of said plurality of data lines to a common line; and
a plurality of wiring leads formed of a conductive layer which are arranged so as to intersect said plurality of data lines, wherein said wiring leads operate as a power source line or signal lines of signals for controlling operation timings of said semiconductor circuit, wherein said row decoder and said column decoder are arranged in parallel with each other, and drive signals for fourth switches which connect said plurality of data lines and said common lines are transmitted from said column decoder by control lines which are formed of the same conductor layer as that of said wiring leads and which pass within a region where said data lines and said word lines exist.

13. A semiconductor circuit according to claim 12, wherein said column decoder and said row decoder are arranged in proximity to each other.

14. A semiconductor memory according to claim 12, further comprising a circuit which clamps said control lines when they are not selected.

15. A semiconductor circuit according to claim 1, wherein said memory cell is composed of a transistor whose control terminal is connected to the word line, and a capacitance portion whose connection with the data line is controlled by said transistor.

16. A semiconductor circuit according to claim 1, wherein said row decoder and said column decoder include drivers for driving the word lines and the data lines respectively.

17. A memory device comprising:
a memory array having a plurality of sub-arrays each of which comprises:
a plurality of word lines;
a plurality of sub data lines which are arranged in a direction intersecting said plurality of word lines, and
a plurality of memory cells which are disposed at points of intersection between said plurality of word lines and said plurality of sub data lines;
a plurality of common lines each of which is arranged in common to at least two of said sub data lines and which is connected to said sub data lines through first switching means;
a plurality of control lines each of which is connected in common to at least two of said first switching means;
a first decoder for selecting at least one of said plurality of word lines; and
a second decoder for selecting one of said plurality of control lines,
wherein said second decoder is arranged on one side of said memory array,
wherein two of said plurality of sub data lines in each sub array form a pair of lines having complementary signals,
wherein each of said memory cells includes a capacitance for storing a signal, and a transistor for connecting between said capacitance and the corresponding sub data line, and wherein said pair lines are respectively arranged in proximity to each other and in parallel with each other, said memory device further comprising a plurality of differential amplifiers for detecting a pair of memory signals on said pair lines.

18. A memory device according to claim 17, wherein said plural control lines are arranged in parallel with said plural data lines, and said pair lines intersect each other midway.

19. A memory device according to claim 17, wherein the longitudinal directions of said first and second decoders are parallel with each other.

20. A memory device comprising:
a memory array having a plurality of sub-arrays each of which comprises:
a plurality of word lines;
a plurality of sub data lines which are arranged in a direction intersecting said plurality of word lines, and
a plurality of memory cells which are disposed at points of intersection between said plurality of word lines and said plurality of sub data lines;
a plurality of common lines each of which is arranged in common to at least two of said sub data lines and which is connected to said sub data lines through first switching means;
a plurality of control lines each of which is connected in common to at least two of said first switching means;
a first decoder for selecting at least one of said plurality of word lines; and
a second decoder for selecting one of said plurality of control lines,
wherein said second decoder is arranged on one side of said memory array,
wherein two of said plurality of sub data lines in each sub array form a pair of lines having complementary siganls,
wherein each of said memory cells includes a flip-flop circuit and second switching means for connecting the input-output terminals of said flip-flop to said pair lines, respectively.

21. A memory device according to claim 20, wherein the longitudinal directions of said first and second decoders are parallel with each other.

22. A memory device according to claim 20, wherein said plural control lines are arranged in parallel with said plural data lines, and said pair lines intersect each other midway.

23. A memroy device according to claim 20, wherein each of said memory cells includes a capacitance for storing a signal, and a transistor for connecting between said capacitance and the corresponding data line, and wherein said pair lines are respectively arranged in proximity to each other and in parallel with each other, said memory device further comprising a plurality of differential amplifiers for detecting a pair of memory signals on said pair lines.

24. A semiconductor circuit according to claim 21, wherein said plurality of data lines are divided into a plurality of sub data lines in a lengthwise direction thereof, said semiconductor circuit further comprising:
a plurality of said common lines each of which is disposed in common for at least two of said sub data lines and is connected to these sub data lines through a third switch; and
control lines which transmit select signals generated by said column decoder, to the first switches in order to drive said third switches and are disposed in parallel with said sub data lines.

25. A semicodnuctor circuit according to claim 21, further comprising a plurality of sense amplifiers each of which differentially amplifies signals of two of said data lines which are arranged in parallel so as to be capacitively coupled with said wiring leads equally.

26. A semiconductor circuit according to claim 21, wherein said memory cell is arranged at only one of two intersection points between said word line and said two data lines which have signals to be differentially amplified.

27. A semiconductor circuit comprising:
  a memory array comprising:
    a plurality of data lines;
    a plurality of word lines which are arranged so as to intersect said plurality of data lines;
    a plurality of memory cells which are disposed at intersection points between said plurality of data lines and said plurality of word lines;
    a row decoder which selects at least one from among said plurality of word lines; and
  a column decoder which generates a signal for connecting one of said plurality of data lines to a common line; and
  a first logic circuit disposed inside the memory array which outputs at least one signal by at least one wiring lead formed of a conductive layer which is arranged so as to intersect said plurality of data lines,
  wherein said data lines are formed of a first layer of aluminum, said wiring leads are formed of a second layer of aluminum, and said word lines are formed of a material which can be used in a self-alignment process.

* * * * *